United States Patent
Yamada

(10) Patent No.: US 7,506,233 B2
(45) Date of Patent: Mar. 17, 2009

(54) INTERFACE CIRCUIT AND METHOD OF TESTING OR DEBUGGING SEMICONDUCTOR DEVICE USING IT

(75) Inventor: Masanori Yamada, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 1909 days.

(21) Appl. No.: 10/097,747

(22) Filed: Mar. 15, 2002

(65) Prior Publication Data

US 2002/0133795 A1 Sep. 19, 2002

(30) Foreign Application Priority Data

Mar. 16, 2001 (JP) ............................... 2001-076236

(51) Int. Cl.
*G01R 31/28* (2006.01)
(52) U.S. Cl. .................. 714/731; 714/726; 714/727; 714/729
(58) Field of Classification Search ................ 714/731, 714/726, 727, 729
See application file for complete search history.

(56) References Cited

FOREIGN PATENT DOCUMENTS

| JP | 60-117819 | 6/1985 |
|----|-----------|--------|
| JP | 1-217274  | 8/1989 |
| JP | 04-213739 | 8/1992 |
| JP | 06-174795 | 6/1994 |
| JP | 07-177017 | 7/1995 |
| JP | 10-031055 | 2/1998 |
| JP | 10-209992 | 8/1998 |

*Primary Examiner*—Jacques Louis-Jacques
*Assistant Examiner*—John J Tabone, Jr.
(74) *Attorney, Agent, or Firm*—Junichi Mimura

(57) ABSTRACT

An interface circuit includes a selection circuit receiving first and second signals, generating a time division serial signal by selecting one of the first and second signals in response to the voltage level of a clock signal provided from the outside of a semiconductor device, and outputting the time division serial signal to a single input terminal of the semiconductor device via a single signal line, a first holding circuit, which is connected to the terminal for receiving the time division serial signal, for capturing and outputting the first signal of the time division serial signal in response to the rise of the clock signal, and a second holding circuit, which is connected to the terminal for receiving the time division serial signal, for capturing and outputting the second signal of the time division serial signal in response to the fall of the clock signal.

31 Claims, 8 Drawing Sheets

INTERFACE CIRCUIT AND METHOD OF TESTING OR DEBUGGING SEMICONDUCTOR DEVICE USING IT

CROSS-REFERENCE TO RELATED APPLICATION

This application claims the priority benefit of Japanese Patent Application No. 2001-076236, filed Mar. 16, 2001, the entire disclosure of which is incorporated herein by reference.

BACKGROUND OF THE INVENTION

1. Field of the Invention

This invention relates to an interface circuit capable of performing a function test or a debugging operation on a semiconductor device, which has been shrunken for a high integration, and further relates to a method of testing and of debugging the semiconductor device using the interface circuit.

2. Description of the Related Art

A semiconductor device includes a microcomputer having a system-software. A function test of the semiconductor device or a debug for detecting and repairing an error of the software is performed by the following method. First, the semiconductor device, which has external terminals, is mounted on a printed board having pads. Then, test pins are contacted to the pads, each of which is connected electrically to one of the external terminals of the semiconductor device. However, since the number of external terminals is increased because of the high integration of the semiconductor device, it is necessary to increase the number of pads on the printed board. Therefore, it is necessary to secure the space for forming pads on the printed board. On the other hand, it is required to mount as many semiconductor devices on the printed board as possible. Thus, increasing the number of pads on the printed board conflicts with increasing the number of semiconductor devices on the printed board.

To avoid this issue, a new semiconductor device is developed. This new semiconductor device corresponds to JTAG (Joint Test Action Group), which was standardized by the IEEE in 1990 as "IEEE standard 1149.1-1990 Standard Access Port and Boundary-Scan Architecture". The semiconductor device corresponding to JTAG includes a plurality of JTAG terminals. When the function test or the debug of the semiconductor device is performed, a test signal (test data) relating to a test logic, which is controlled by a host computer and a instruction signal (instruction data) relating to the debug are inputted to the semiconductor device via the JTAG terminals. After the function test or the debug is completed in the semiconductor device, a signal (data), which is a result of the function test or the debug, is outputted from the JTAG terminals. The number of JTAG terminals equals the number of kinds of JTAG signals, and a single kind of JTAG signal is inputted in or outputted from each JTAG terminal. The above-mentioned JTAG signals are inputted to or outputted from an internal circuit of the semiconductor device via a TAP (Test Access Port) controller of the semiconductor device or a variety of registers, which recognize the JTAG signals. The TAP controller controls the internal circuit of the semiconductor device in response to the JTAG signals.

However, the requirements for the high integration and downsizing are further intensified. It is not so easy to form interface signal terminals including JTAG terminals, the TAP controller for controlling the JTAG signals, and some circuits for the JTAG such as the registers in the high integrated and downsized semiconductor device. Thus, in the semiconductor device in the related art, the interface signal terminals including the JTAG terminals are located close to each other.

To avoid shorting out between the interface signal terminals, it is desired to reduce the number of JTAG terminals as possible.

SUMMARY OF THE INVENTION

It is therefore an object of the invention to resolve the above-described problem and provide an interface circuit whose interface signal terminals are reduced as many as possible to avoid shorting out between the interface signal terminals, and provide a method of testing, and of debugging a semiconductor device, using the interface circuit.

The object is achieved by an interface circuit transferring a clock signal and first and second interface signals inputted from the outside of a semiconductor device to an internal circuit of the semiconductor device. The interface circuit includes a selection circuit receiving the first and second interface signals, generating a time division serial output signal by selecting one of the first and second interface signals in response to the voltage level of the clock signal, and outputting the time division serial output signal to a single input terminal of the semiconductor device via a single signal line, a first holding circuit connected to the single input terminal for receiving the time division serial output signal, the first holding circuit capturing the first interface signal of the time division serial output signal in response to the transition of the voltage level of the clock signal from a L level to a H level and outputting the first interface signal to the internal circuit, and a second holding circuit connected to the single input terminal for receiving the time division serial output signal, the second holding circuit capturing the second interface signal of the time division serial output signal in response to the transition of the voltage level of the clock signal from the H level to the L level and outputting the second interface signal to the internal circuit.

The object is achieved by another interface circuit transferring a clock signal and first and second interface signals inputted from the outside of a semiconductor device to an internal circuit of the semiconductor device. This interface circuit includes a first frequency converting circuit generating a second clock signal having a second frequency by multiplying the first frequency of the first clock signal, a first two-bit counter connected to the first frequency converting circuit for outputting a signal having four counted values, a selection circuit receiving the first through third interface signals and the signal having the fixed voltage, generating a first time division serial output signal by selecting one of the first through three interface signals and the signal having the fixed voltage in response to the signal outputted from the first two-bit counter, and outputting the first time division serial output signal to a single input terminal of the semiconductor device via a single signal line, the first time division serial output signal consisting of the first through third interface signals and the signal having the fixed voltage, a serial signal input circuit receiving the first time division serial output signal, outputting a second time division serial output signal, which is delayed from the first time division serial output signal for one cycle of the second clock signal in response to the second clock signal, outputting a third time division serial output signal, which is delayed from the second time division serial output signal for one cycle of the second clock signal in response to the second clock signal, and outputting a fourth time division serial output signal, which is delayed from the third time division serial output signal for one cycle of the second clock signal in response to the second clock signal, a second frequency converting circuit generating a third clock signal having the first frequency by converting the second frequency of the second clock signal, a control signal generating circuit outputting a control signal in response to the second and third clock signal and the fourth time division serial output signal, and a parallel signal output circuit capturing the first interface signal of the first time division serial output signal, capturing the second interface signal of the second time division serial output signal, capturing the third interface signal of the third time division serial output signal, in response to the control signal, and outputting the first through third interface signals.

The object is achieved by a method of testing or debugging a semiconductor device by transferring a clock signal and first and second interface signals inputted from the outside of a semiconductor device to an internal circuit of the semiconductor device. The method of testing or debugging a semiconductor device includes generating a time division serial output signal by selecting one of the first and second interface signals in response to the voltage level of the clock signal, transferring the time division serial output signal to a single input terminal of the semiconductor device via a single signal line, and then transferring the time division serial output signal to first and second hold circuit, capturing the first interface signal of the time division serial output signal in the first holding circuit in response to the transition of the voltage level of the clock signal from a L level to a H level, and outputting the first interface signal, capturing the second interface signal of the time division serial output signal in the second holding circuit in response to the transition of the voltage level of the clock signal from the H level to the L level, and outputting the second interface signal, transferring the clock signal, the first interface signal outputted from the first holding circuit, and the second interface signal outputted from the second holding circuit to a control circuit, which controls the operation of the internal circuit, and transferring the first and second interface signals inputted to the control circuit to the internal circuit in response to the clock circuit inputted to the control circuit in order to perform the test or the debug based on the clock signal and the first and second interface signals.

The object is achieved by another method of testing or debugging a semiconductor device by transferring a clock signal and first and second interface signals inputted from the outside of a semiconductor device to an internal circuit of the semiconductor device. This method of testing or debugging a semiconductor device includes converting a first clock signal having a first frequency provided from the outside of the semiconductor device to a second clock signal having a second frequency, which is multiplied from the first frequency, and outputting the second clock signal to the semiconductor device and a first two-bit counter, generating a signal having four counted values in the first two-bit counter, and outputting the signal having four counted values to a selection circuit, generating a first time division serial output signal by selecting one of the first through three interface signals and a signal having the fixed voltage inputted to the selection circuit in response to the signal outputted from the first two-bit counter, outputting the first time division serial output signal, which consists of the first through third interface signals and the signal having the fixed voltage, to a single input terminal of the semiconductor device via a single signal line, and then transferring the first time division serial output signal on the single input terminal to a serial signal input circuit, generating, based on the first time division serial output signal, a second time division serial output signal, which is delayed from the first time division serial output signal for one cycle of the second clock signal in response to the second clock signal, generating, based on the second time division serial output signal, a third time division serial output signal, which is delayed from the second time division serial output signal for one cycle of the second clock signal in response to the second clock signal, and generating, based on the third time division serial output signal, a fourth time division serial output signal, which is delayed from the third time division serial output signal for one cycle of the second clock signal in response to the second clock signal, in the serial signal input circuit, transferring the first time division serial output signal on the single input terminal and the second and third time division serial output signal outputted from the serial signal input circuit to the parallel signal output circuit, converting the second clock signal having the second frequency inputted to the semiconductor device to a third clock signal having the first frequency, and then inputting the third clock signal a control signal generating circuit and a control circuit, which controls the operation of the internal circuit, generating a control signal in response to the second and third clock signal, which are inputted to the control signal generating circuit, and the fourth time division serial output signal, and then outputting the control signal to a parallel signal output circuit, capturing the first interface signal of the first time division serial output signal, the second interface signal of the second time division serial output signal, the third interface signal of the third time division serial output signal in the parallel signal output circuit, in response to the control signal, and outputting the first through third interface signals to the control circuit;, transferring the first through third interface signals to the control circuit to the internal circuit in response to the third clock circuit inputted to the control circuit in order to perform the test or the debug based on the third clock signal and the first through third interface signals.

The above and further objects and novel features of the invention will more fully appear from the following detailed description, appended claims and accompanying drawings.

DETAILED DESCRIPTION OF THE PREFERRED EMBODIMENTS

First Preferred Embodiment

Figure 1:
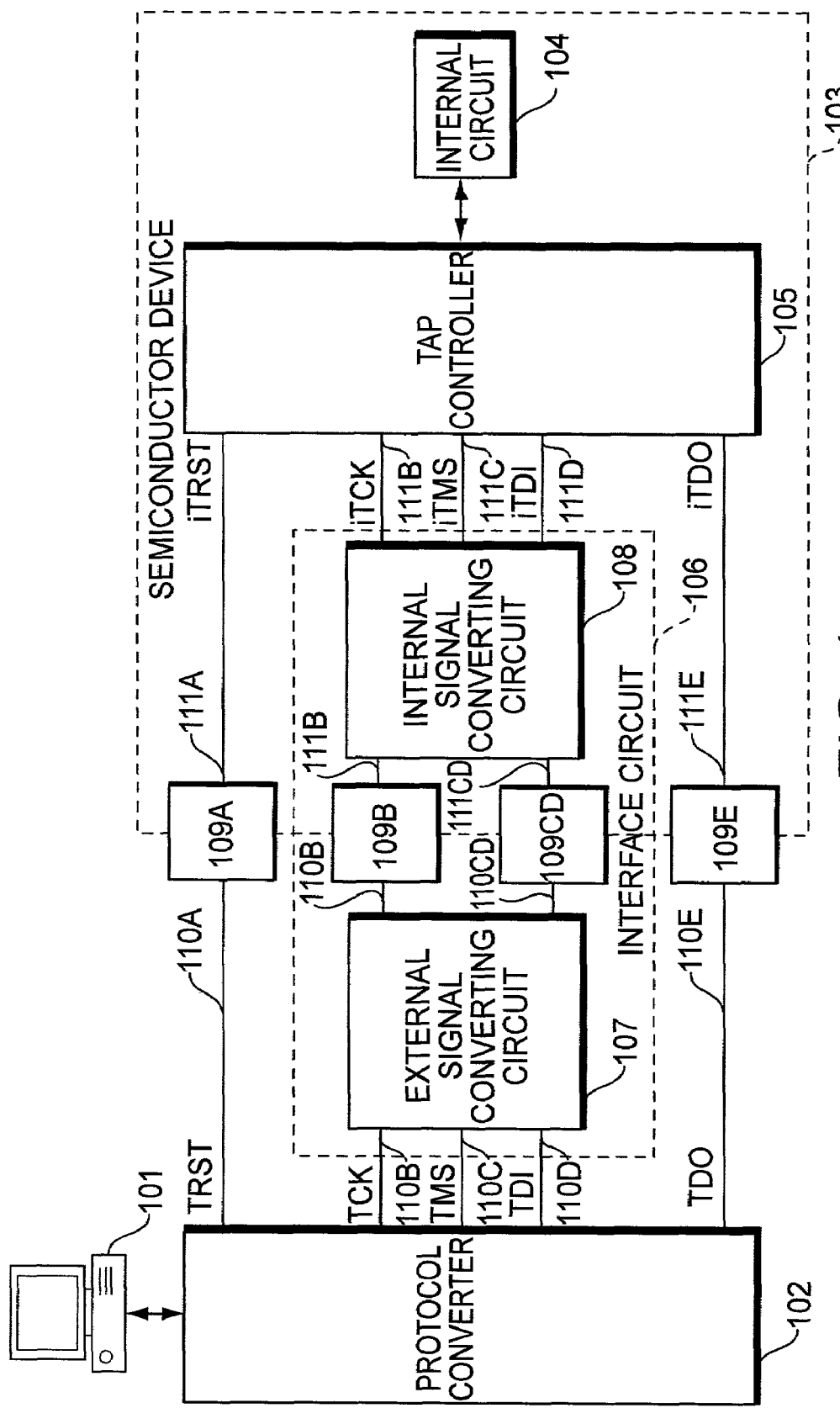
FIG. 1 is an overview of an interface circuit according to a first embodiment of the invention.

Referring to FIG. 1, a system for testing a function and for debugging includes a host computer 101, a protocol converter 102, a semiconductor device 103 and an interface circuit 106. The interface circuit 106 transfers signals standardized by JTAG from the host computer 101 to the semiconductor device 103 or from the semiconductor device 103 to the host computer 101.

The host computer 101 controls or watches the function test or the debug of the semiconductor device 103. The host computer 101 is connected to the semiconductor device via the protocol converter 102 and the interface circuit 106.

The host computer 101 is connected to the protocol converter 102 by a universal serial bus interface. The host computer 101 sends test signals for the function test or the instruction signal for the debug to the protocol converter 102, or receives and analyzes signals, which were outputted from the semiconductor device 103 as a result of the test or debug.

The protocol converter 102 converts the signals sent from the host computer 101 to JTAG interface signals standardized by JTAG, and then sends the JTAG interface signals to the semiconductor device 103. The protocol converter 102 also converts the JTAG interface signals sent from the semiconductor device 103 to signals that can be analyzed by the host computer 101, and then sends them to the host computer 101. That is, the protocol converter 102 has a function to convert the communication format between the protocol converter 102 and the semiconductor device 103.

The semiconductor device 103 includes an internal circuit 104 and a TAP controller 105 connected to the internal circuit 104. The internal circuit 104 performs a primary function of the semiconductor device. The TAP controller controls the function test or the debug of the internal circuit 104 in the semiconductor device 103 in response to the JTAG interface signals.

The JTAG interface signals, which are outputted from or inputted to the protocol converter 102, are explained below. When the function test or the debug is performed under the JTAG standard, five(5) JTAG interface signals are used. These are, (1) a test clock signal TCK, which is an independent from a system clock, (2) a test reset signal TRST for initializing the TAP controller 105, (3) a test mode select signal TMS for controlling the test or debug operation, and for switching the operation of the internal circuit 104 to the test mode or the debug mode, (4) a serial data input signal TDI, which is a serial-input instruction signal of the test or the debug, and (5) a serial data output signal TDO, which is a result of the test or the debug. The test mode select signal TMS and the serial data input signal TDI are sampled in response to the successive transitions of the logic level of the test clock signal TCK from a L level to a H level in the TAP controller 105. On the other hand, the serial data output signal TDO is outputted from the TAP controller 105 in response to the successive transitions of the logic level of the test clock signal TCK from the H level to the L level. The protocol converter 102 includes at least two flip-flop circuits, and each flip-flop circuit outputs one of the test mode select signal TMS and the serial data input signal TDI. Thus, the test mode select signal TMS and the serial data input signal TDI are outputted serially in response to the level change of the test clock signal TCK, which is inputted to each flip-flop circuit. Each of above-described JTAG interface signals is called "Test" XXX signal. However, these interface signals are not only in use for the function test of the semiconductor device 103, but also in use for the debug of the semiconductor device 103.

The interface circuit 106 connects the protocol converter 102 to the TPA controller 105 in the semiconductor device 103. The interface circuit 106 includes an external signal converting circuit 107, which is located outside the semiconductor device 103, and an internal signal converting circuit 108, which is located inside the semiconductor device 103. The external signal converting circuit 107 is connected to the protocol converter 102 by three (3) interface signal lines 110B, 110C, 110D, each of which transfers one of the test clock signal TCK, the test mode select signal TMS and the serial data input signal TDI, respectively. As well, the internal signal converting circuit 108 is connected to the TPA controller 105 by three (3) interface signal lines 111B, 111C, 111D, each of which transfers one of an internal test clock signal iTCK, an internal test mode select signal iTMS and an internal serial data input signal iTDI, respectively. The external signal converting circuit 107 is connected to the internal signal converting circuit 106 by interface signal terminals 109B, 109CD, interface signal lines 111B, 111CD, which are formed in the semiconductor device 103, and interface signal lines 110B, 110CD, which are located outside the semiconductor device 103.

The protocol converter 102 is connected to the TAP controller 105 by interface signal terminals 109A, 109E, interface signal lines 111A, 111E, which are formed in the semiconductor device 103, and interface signal lines 110A, 110E, which are located outside the semiconductor device 103.

The test reset signal TRST on the interface signal line 110A is transferred on the interface signal line 111A as the internal test reset signal iTRST via the interface signal terminal 109A. On the other hand, the internal serial data output signal ITDO on the interface signal line 111E, which is outputted from the TPA controller 105, is transferred on the interface signal line 110E as the serial data output signal TDO via the interface signal terminal 109E.

The structures of the external signal converting circuit 107 and of the internal signal converting circuit 108 are explained with reference to FIGS. 2 and 3 as follows.

Figure 2:
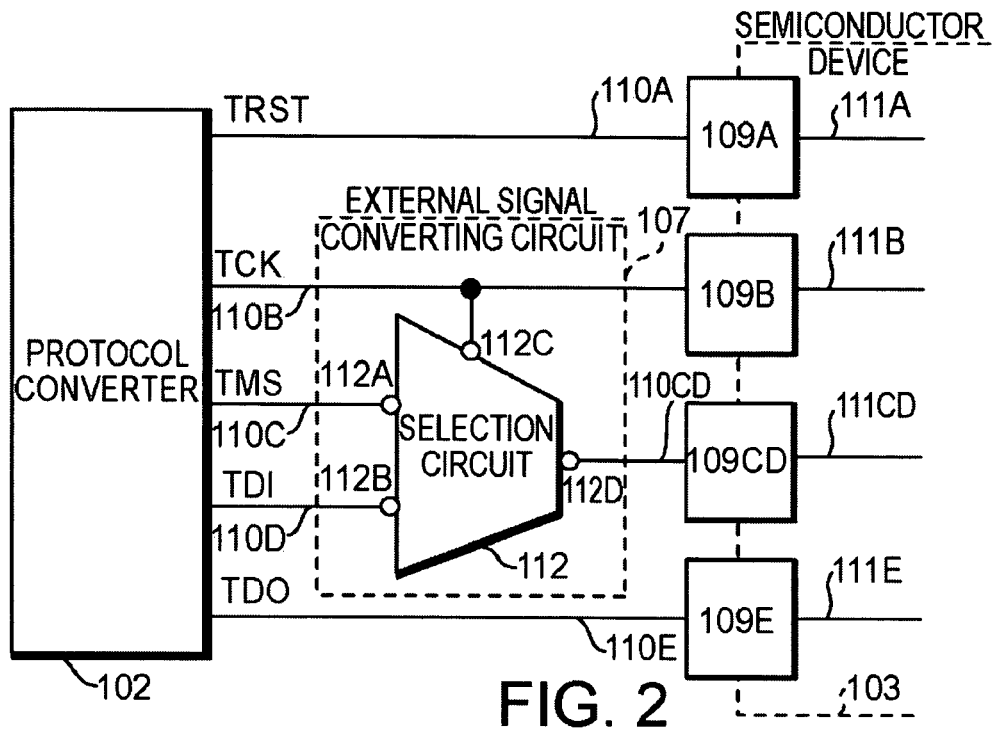
FIG. 2 is a circuit diagram of an external signal conversion circuit in the interface circuit of FIG. 1.

Referring to FIG. 2, the external signal converting circuit 107 includes a selection circuit 112 having first and second input terminals 112A, 112B. The first input terminal 112A is connected to the interface signal line 110C, and the second input terminal 112B is connected to the interface signal line 110D. In other words, the selection circuit 112 receives the test mode select signal TMS, which is outputted from the protocol converter 102, at the first input terminal 112A, and receives the serial data input signal TDI, which is also outputted from the protocol converter 102, at the second input terminal 112B. The selection circuit 112 also includes a control terminal 112C. The control terminal 112C is connected to the interface signal line 110B. The selection circuit 112 receives the test clock signal TCK at its control terminal 112C. An output terminal 112D of the selection circuit 112 is connected to the interface signal line 110CD. The selection circuit 112 selects and outputs one of the signals TMS, TDI in response to the logic level of the test clock signal TCK inputted to the control terminal 112C. In this embodiment, when the logic level of the test clock signal TCK is at the H level, the test mode select signal TMS is selected and outputted to the interface signal line 110CD from the output terminal 112D of the selection circuit 112. On the other hand, when the logic level of the test clock signal TCK is at the L level, the serial data input signal TDI is selected and outputted to the interface signal line 110CD from the output terminal 112D of the selection circuit 112. That is, the selection circuit 112 time-divides the test mode select signal TMS and the serial data input signal TDI, and outputs them serially to the single interface signal line 110CD as time division serial output signal.

The interface signal line 110B is connected to both of the control terminal 112C of the selection circuit 112 and the interface signal terminal 109B of the semiconductor device 103. Therefore, the test clock signal TCK is inputted to the selection circuit 112 via the control terminal 112C and is inputted to the semiconductor device 103 via the interface signal terminal 109B simultaneously. Then, the test clock signal TCK on the transfer signal terminal 109B is transferred on the transfer signal line 111B as the internal test clock signal iTCK.

Figure 3:
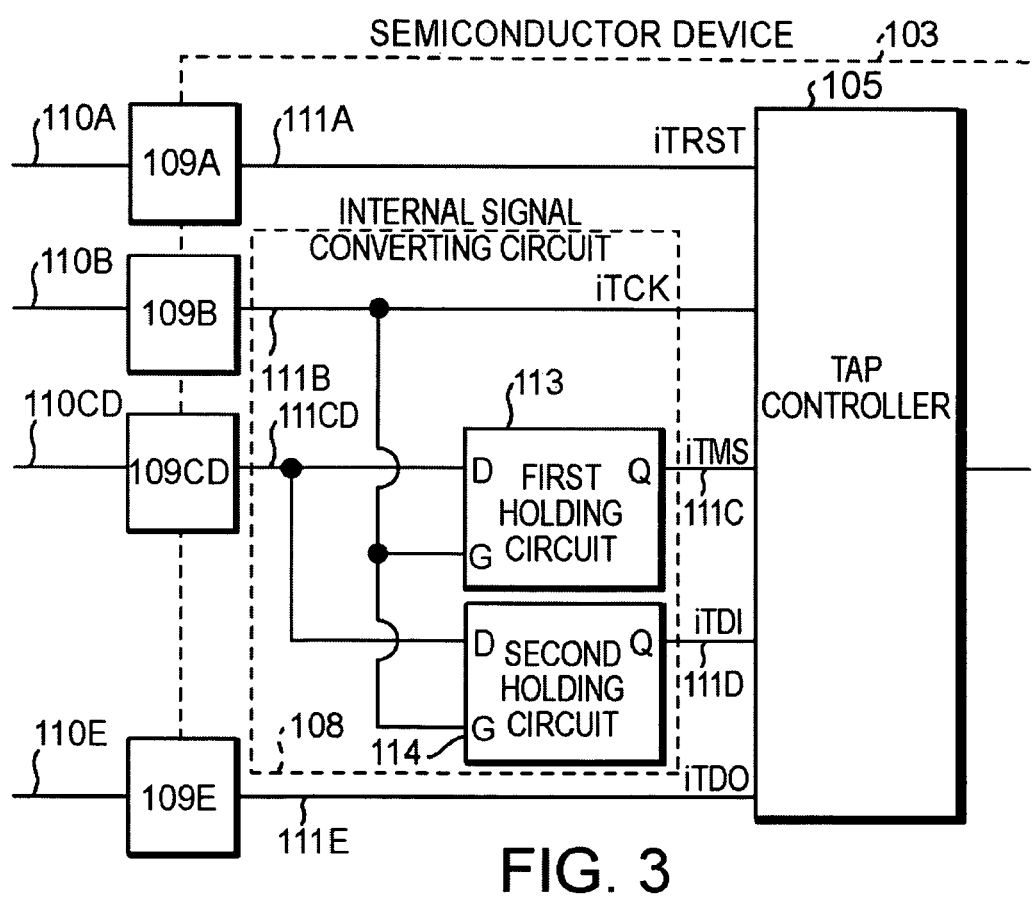
FIG. 3 is a circuit diagram of an internal signal conversion circuit in the interface circuit of FIG. 1.

Referring to FIG. 3, the interface signal terminal 109B and the TAP controller 105 are connected to each other by the interface signal line 111B. Thus, the internal test clock signal iTCK is transferred to the TAP controller 105 via the interface signal line 111B from the interface signal terminal 109B.

The internal signal converting circuit 108 includes a first holding circuit 113 and a second holding circuit 114. An input terminal D of the first holding circuit 113 and an input terminal D of the second holding circuit 114 are commonly connected to the interface signal line 111CD, which is connected to the interface signal terminal 109CD. Therefore, the time division serial output signal (namely, serial signal of the test mode select signal TMS and the serial data input signal TDI), which are inputted to the interface signal terminal 109CD, are transferred to the first and second holding circuit 113, 114 as the internal test mode select signal iTMS and the internal serial data input signal iTDI. A control terminal G of the first holding circuit 113 and a control terminal G of the second holding circuit 114 are commonly connected to the signal transfer line 111B, which transfers the internal test clock signal iTCK. A output terminal Q of the first holding circuit 113 and a output terminal Q of the second holding circuit 114 are connected to the TAP controller 105 via the signal transfer lines 111C, 111D, respectively. Thus, in the internal signal converting circuit 108, the test mode select signal TMS and the serial data input signal TDI, which are time divided and outputted serially as the time division serial output signal from the external signal converting circuit 107, are separated into the internal test mode select signal iTMS and the internal serial data input signal iTDI, and then they are outputted to the TAP controller 105 as the different signal by the following operation.

While the internal test clock signal iTCK, which is inputted to the control terminal G of the first holding circuit 113, is at the H level, the first holding circuit 113 holds the internal test mode select signal iTMS, which is inputted to the input terminal D of the first holding circuit 113 because the test mode select signal TMS is selected by the selection circuit 112 during the test clock signal TCK having the H level, and then, outputs the internal test mode select signal iTMS held in the first holding circuit 113 from its output terminal Q to the TAP controller 105. After that, the logic level of the internal test clock signal iTCK is changed to the L level. While the logic level of the internal test clock signal iTCK is maintained at the L level, the first holding circuit 113 continues to hold and output the internal test mode select signal iTMS to the TAP controller 105 because the first holding circuit 113 does not capture any signals inputted to its input terminal D during the internal test clock signal iTCK having the L level inputted to its control terminal G. Thus, the first holding circuit 113 can be called a high-latch-type holding circuit.

On the other hand, while the internal test clock signal iTCK, which is inputted to the control terminal G of the second holding circuit 114, is at the L level, the second holding circuit 113 holds the internal serial data input signal iTDI, which is inputted to the input terminal D of the second holding circuit 114 because the serial data input signal TDI is selected by the selection circuit 112 during the test clock signal TCK having the L level, and then, outputs the internal serial data input signal iTDI held in the second holding circuit 114 from its output terminal Q to the TAP controller 105. After that, the logic level of the internal test clock signal iTCK is changed to the H level. While the logic level of the internal test clock signal iTCK is maintained at the H level, the second holding circuit 114 continues to hold and output the internal serial data input signal iTDI to the TAP controller 105 because the second holding circuit 114 does not capture any signals inputted to its input terminal D during the internal test clock signal iTCK having the H level inputted to its control terminal G. Thus, the second holding circuit can be called a low-latch-type holding circuit.

Next, the operation of the function test and the debug using the interface circuit 106, which connects the host computer 101 to the semiconductor device 103, is explained below with reference to FIGS. 4A-4C.

The test data for the function test of the semiconductor device 103 or the instruction data for the debug of the semiconductor device 103 are outputted from the host computer 101 to the protocol converter 102. The test data and the instruction data are converted to the JTAG interface signals (the test clock signal TCK, the test reset signal TRST, the test mode select signal TMS, the serial data input signal TDI) in the protocol converter 102, and the JTAG interface signals TCK, TRST, TMS, TDI are sent to the external converting circuit 107. Each of the JTAG interface signals is changed as shown in FIG. 4A. For example, the test mode select signal TMS becomes a first test mode select signal TMS1, a second test mode select signal TMS2, a third test mode select signal TMS3 and so on in response to successive transitions of the test clock signal TCK from the L level to the H level. Each of the first through third test mode select signals TMS1-3 is outputted from the protocol converter 102 after the level of the test clock signal TCK is changed to the H level completely. As well, the test serial data input signal TDI becomes a first test serial data input signal TDI1, a second test serial data input signal TDI2, a third test serial data input signal TDI3 and so on in response to successive transitions of the test clock signal TCK from the L level to the H level. Each of the first through third test serial data input signals TDI1-3 is outputted from the protocol converter 102 after the level of the test clock signal TCK changed to the H level completely. Therefore, the changes of these signals TMS1-3, TDI1-3 are delayed from the transition of the test clock signal TCK from the L level to the H level.

Figure 4:
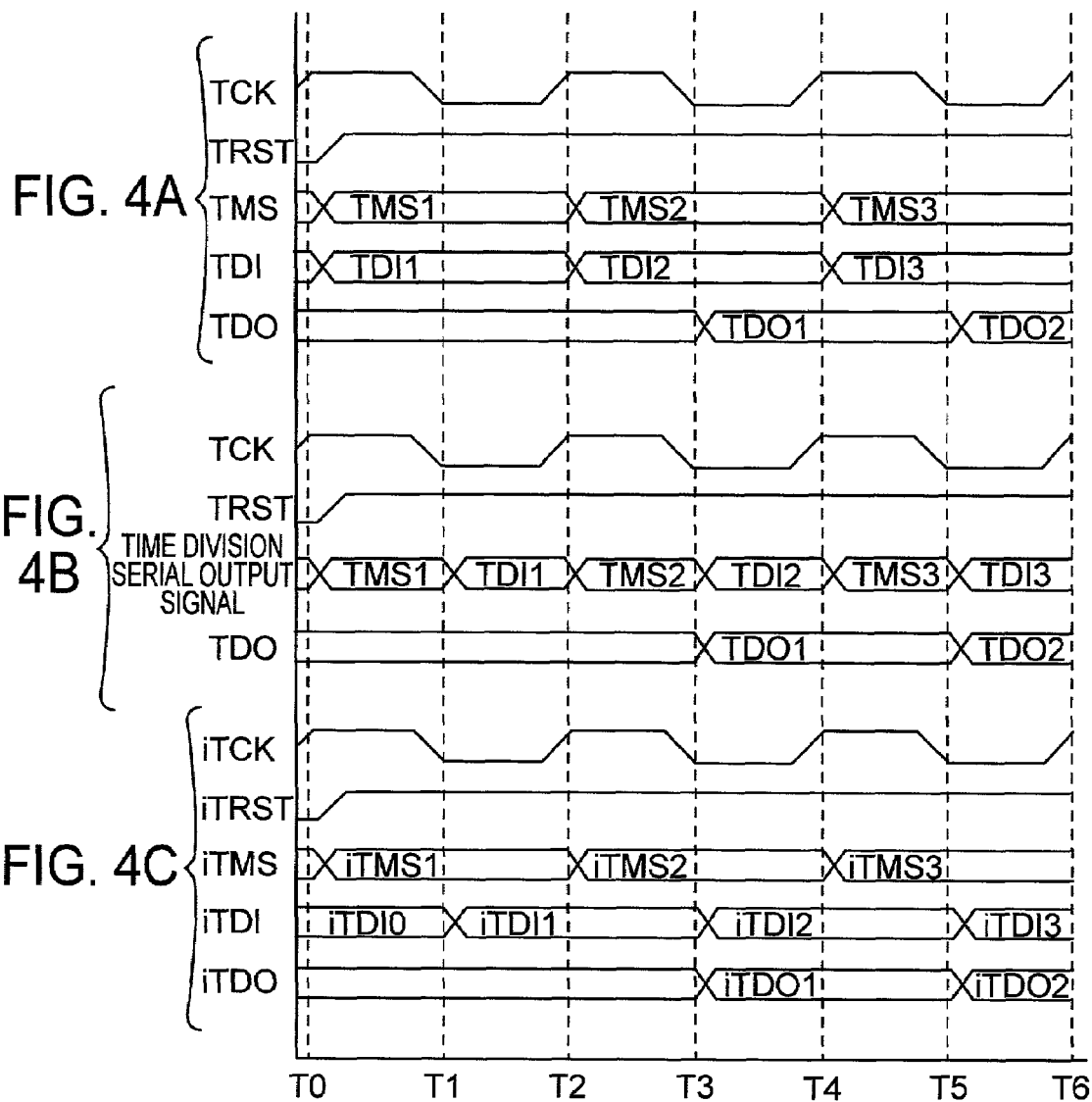
FIG. 4A is a timing chart of JTAG interface signals transferred between an external signal converting circuit and a protocol converter, each of which is shown in FIG. 1.
FIG. 4B is a timing chart of JTAG interface signals transferred between the external signal converting circuit and an internal signal converting circuit, each of which is shown in FIG. 1.
FIG. 4C is a timing chart of JTAG interface signals transferred between internal signal converting circuit and a TAP controller, each of which is shown in FIG. 1.

As shown in FIG. 4B, after a time T0, while the logic level of the test clock signal TCK is at the H level, the first test mode select signal TMS1, which is inputted to the first input terminal 112A of the selection circuit 112, is selected by the selection circuit 112, and the first test mode select signal TMS1 is outputted from the output terminal 112D of the selection circuit 112. After that, when the logic level of the test clock signal TCK is changed to the L level at a time T1, the first serial data input signal TDI1 is selected by the selection circuit 112, and the first serial data input signal TDI1 is outputted from the output terminal 112D of the selection circuit 112.

After that, when the logic level of the test clock signal TCK is changed to the H level at a time T2, the test mode select signal TMS becomes the second test mode select signal TMS2 and the serial data input signal TDI1 becomes the second serial data input signal TDI2. While the logic level of the test clock signal TCK is at the H level, the second test mode select signal TMS2 is selected and the second test mode select signal TMS2 is outputted from the output terminal 112D of the selection circuit 112. After that, when the logic level of the test clock signal TCK is changed to the L level at a time T3, the second serial data input signal TDI2 is selected by the selection circuit 112, and the second serial data input signal TDI2 is outputted from the output terminal 112D of the selection circuit 112. By repeating the above-described operation, the time division serial output signal consisting of the test mode select signal TMS and the serial data input signal TDI is outputted to the interface signal terminal 109CD of the semiconductor device 103.

As described above, since the test clock signal TCK is inputted to the control terminals 112 of the selection circuit 112 and to the interface signal terminal 109B, the waveform of the test clock signal TCK shown in FIG. 4B, which is inputted to the interface signal terminal 109B, is the same as the waveform of the test clock signal TCK shown in FIG. 4A, which is outputted from the protocol converter 102. The test clock signal TCK is inputted to the TAP controller 105 as the internal test clock signal iTCK from the interface signal terminal 109B via interface signal line 111B. As shown in FIG. 4C, The internal test clock signal iTCK has a waveform that is the same as these of the test clock signals TCK of FIGS. 4B, 4C As described above, the test reset signal TRST is outputted from the protocol converter 102 to the interface signal terminal 109A of the semiconductor device 103 via the interface signal line 110A. Therefore, the waveform of the test reset signal TRST shown in FIG. 4B, which is inputted to the interface signal terminal 109A is the same as the waveform of the test reset signal TRST shown in FIG. 4A, which is outputted from the protocol converter 102. The test reset signal TRST is inputted to the TAP controller 105 as the internal test reset signal iTRST from the interface signal terminal 109A via interface signal line 111A. As shown in FIG. 4C, the internal test reset signal iTRST has a waveform that is the same as these of the test reset signals TRST of FIGS. 4B, 4C.

As described above, the time division serial output signal TMS or TDI on the interface signal terminal 109CD is inputted to the input terminals D of the first and second holding circuit 113, 114 in the internal signal converting circuit 108 via the interface signal line 111CD. The internal test clock signal iTCK is inputted to the control terminals G of the first and second holding circuit 113, 114 via the interface signal line 111B. The internal test mode select signal iTMS is outputted from the output terminal Q of the first holding circuit 113, and the internal serial input signal iTDI is outputted from the output terminal Q of the second holding circuit 114.

The waveforms of the internal test mode select signal iTMS and the internal serial input signal iTDI during time T0-T4 are explained below with reference to FIG. 4C mainly.

During time T0-T1, since the logic level of the test clock signal TCK is at the H level, the test mode select signal TMS is selected by the selection circuit 112. Therefore, as shown in FIG. 4B, the selection circuit 112 outputs the first test mode select signal TMS1 as the time division serial output signal to the interface signal terminal 109CD. Further, as shown in FIG. 4C, the logic level of the internal test clock signal iTCK is at the H level, and the internal test clock signal iTCK having the H level is inputted to the first and second holding circuits 113, 114. The first holding circuit 113 holds the first test mode select signal TMS1 outputted from the selection circuit 112 in response to the internal test clock signal iTCK having the H level inputted to the control terminal G of the first holding circuit 113. Then, the first holding circuit 113 outputs the first internal test mode select signal iTMS1 from its output terminal Q to the TAP controller 105.

During time T0-T1, the first test mode select signal TMS1 is also inputted to the data terminal D of the second holding circuit 114. However, since the internal test clock signal iTCK having the H level is inputted to the control gate G of the second holding circuits 114, the second hold circuit 114 does not capture any data inputted to its data terminal D. Therefore, the signal outputted from the second holding circuit 114 is not changed. That is, during time T0-T1, the second holding circuit 114 outputs the signal such as the internal serial data input signal iTD10 shown in FIG. 4C, which was outputted before the logic level of the test clock signal TCK is changed to the H level, to the TAP controller 105.

During time T1-T2, since the logic level of the test clock signal TCK is changed to the L level, the serial data input signal TDI is selected by the selection circuit 112. Therefore, as shown in FIG. 4B, the selection circuit 112 outputs the first serial data input signal TDI1 as the time division serial output signal to the interface signal terminal 109CD. Further, as shown in FIG. 4C, the logic level of the internal test clock signal iTCK is changed to the L level, and the internal test clock signal iTCK having the L level is inputted to the first and second holding circuits 113, 114. The second holding circuit 114 holds the first serial data input signal TDI1 outputted from the selection circuit 112 in response to the internal test clock signal iTCK having the L level inputted to the control terminal G of the second holding circuit 114. Then, the second holding circuit 114 outputs the first internal serial data input signal iTDI1 from its output terminal Q to the TAP controller 105.

During time T1-T2, the first serial data input signal TDI1 is also inputted to the data terminal D of the first holding circuit 113. However, since the internal test clock signal iTCK having the L level is inputted to the control gate G of the first holding circuits 113, the first hold circuit 113 does not capture any data inputted to its data terminal D. Therefore, the signal outputted from the first holding circuit 113 is not changed. That is, during time T1-T2, the first holding circuit 114 continues to output the internal first test mode select signal iTMS1 to the TAP controller 105.

During time T2-T3, since the logic level of the test clock signal TCK is changed to the H level again, the test mode select signal TMS is selected by the selection circuit 112. Therefore, as shown in FIG. 4B, the selection circuit 112 outputs the second test mode select signal TMS2 as the time division serial output signal to the interface signal terminal 109CD. Further, as shown in FIG. 4C, the logic level of the internal test clock signal iTCK is changed to the H level, and the internal test clock signal iTCK having the H level is inputted to the first and second holding circuits 113, 114. The first holding circuit 113 holds the second test mode select signal TMS2 outputted from the selection circuit 112 in response to the internal test clock signal iTCK having the H level inputted to the control terminal G of the first holding circuit 113. Then, the first holding circuit 113 outputs the second internal test mode select signal iTMS2 from its output terminal Q to the TAP controller 105.

During time T2-T3, the first test mode select signal TMS1 is also inputted to the data terminal D of the second holding circuit 114. However, since the internal test clock signal iTCK having the H level is inputted to the control gate G of the second holding circuits 114, the second hold circuit 114 does not capture any data inputted to its data terminal D. Therefore, the signal outputted from the second holding circuit 114 is not changed. That is, during time T2-T3, the second holding circuit 114 continues to output the internal first serial data input signal iTDI1 to the TAP controller 105.

During time T3-T4, since the logic level of the test clock signal TCK is changed to the L level, the serial data input signal TDI is selected by the selection circuit 112. Therefore, as shown in FIG. 4B, the selection circuit 112 outputs the second serial data input signal TDI2 as the time division serial output signal to the interface signal terminal 109CD. Further, as shown in FIG. 4C, the logic level of the internal test clock signal iTCK is changed to the L level, and the internal test clock signal iTCK having the L level is inputted to the first and second holding circuits 113, 114. The second holding circuit 114 holds the second serial data input signal TDI2 outputted from the selection circuit 112 in response to the internal test clock signal iTCK having the L level inputted to the control terminal G of the second holding circuit 114. Then, the second holding circuit 114 outputs the second internal serial data input signal iTDI2 from its output terminal Q to the TAP controller 105.

During time T3-T4, the second serial data input signal TDI2 is also inputted to the data terminal D of the first holding circuit 113. However, since the internal test clock signal iTCK having the L level is inputted to the control gate G of the first holding circuits 113, the first hold circuit 113 does not capture any data inputted to its data terminal D. Therefore, the signal outputted from the first holding circuit 113 is not changed. That is, during time T3-T4, the first holding circuit 114 continues to output the internal second test mode select signal iTMS2 to the TAP controller 105.

After time T4, the above-described operation is repeated. That is, the first holding circuit 113 outputs a third internal test mode select signal iTMS3 during time T4-T6, and outputs a fourth internal test mode select signal iTMS4 during time T6-T8 and so on. On the other hand, the second holding circuit 114 continues to output the second internal serial data input signal iTDI2 during time T4-T5, and outputs a third internal test mode select signal iTDI3 during time T5-T7 and so on.

According to the signal operation described above, the TAP controller 105 receives the JTAG interface signals TCK, TRST, TMS, TDI from the host computer 101 via the protocol converter 102 and the interface circuit 105

The TAP controller 105 captures the internal test mode select signal iTMS and the internal serial data input signal iTDI in response to successive transition of the internal test clock signal iTCK from the L level to the H level. For example, as shown in FIG. 4C, just before time T2, the TAP controller 105 captures the first internal test mode select signal iTMS1 and the first internal serial data input signal iTDI1 in response to the rise of the internal test clock signal iTCK. Further, just before time T4, the TAP controller 105 captures the second internal test mode select signal iTMS2 and the second internal serial data input signal iTDI2 in response to the rise of the internal test clock signal iTCK.

The function test or the debug of the internal circuit 104 of the semiconductor device 103 is performed by the signals captured by the TAP controller 105. After the function test or the debug has been performed, a signal showing the result of the function test or the debug is outputted from the internal circuit 104 to the TAP controller 105. The TAP controller 105 sends an internal serial data output signal iTDO showing the result of the function test or the debug in response to the transition of the internal test clock signal iTCK from the H level to the L level. For example, as shown in FIG. 4C, just before time T5, a certain internal serial data output signal iTDO becomes another internal serial data output signal iTDO.

The internal serial data output signal iTDO is transferred to the protocol converter 102 via the interface signal terminal 109E as the serial data output signal TDO. Then, the serial data output signal TDO is transferred to the host computer 101 to be analyzed as to the function test or the debug.

According to the first embodiment, the interface circuit 106 includes the external signal converting circuit 107 outside the semiconductor device 103, and the internal signal converting circuit 108 in the semiconductor device 103. The external signal converting circuit 107 includes the selection circuit 112. The test mode select signal TMS and the serial data input signal TDI of the JTAG interface signals are time-divided by the selection circuit 112, and the test mode select signal TMS and the internal serial input signal TDI as the time division serial output signal are outputted serially on the single interface line 110CD and on the single interface line 111CD between the external signal converting circuit 107 and the internal signal converting circuit 108. Further, the internal signal converting circuit 108 includes the first holding circuit 113 and the second holding circuit 114, which captures the signal at the different timing using the transition of the level of the internal test clock signal iTCK. These first and second holding circuits 113, 114 output the test mode select signal TMS and the serial data input signal TDI to the TAP controller 105 using two different interface signal lines 111C, 111D separately. Therefore, it is possible to reduce the number of interface signal terminals, which are used for transferring the JTAG interface signal for the function test or the debug. Thus, it is possible to secure a space between the interface signal terminals formed on the semiconductor device enough to avoid electric short by contacting the terminals. That is, according to the first embodiment, since the number of interface signal terminals can be reduced in the downsized semiconductor device, an accurate function test or an accurate debug can be performed using the JTAG interface signals. Further, by reducing the number of interface signal terminals, the production cost of the semiconductor device also can be reduced.

Second Preferred Embodiment

In the second embodiment, the detail of each of a host computer 201, a protocol converter 202, a TAP controller 205 and an internal circuits 204 is omitted for the sake of brevity because functions and the connections of them are the same as the host computer 101, the protocol converter 102, the TAP controller 105 and the internal circuits 104 disclosed in the first embodiment.

Figure 5:
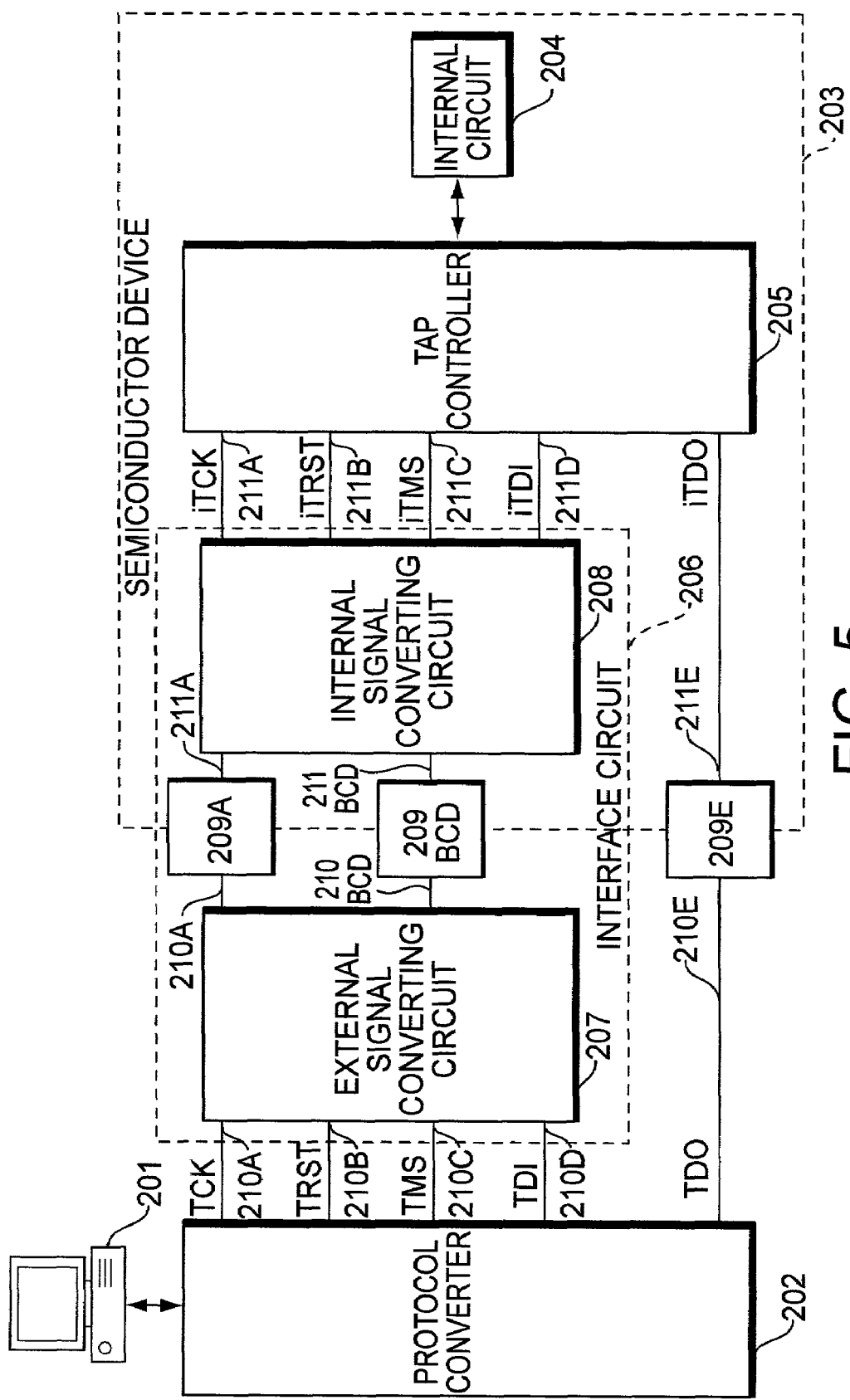
FIG. 5 is an overview of an interface circuit according to a second embodiment of the invention.

Referring to FIG. 5, the protocol converter 202 is connected to the TAP controller 205 by an interface circuit 206. The interface circuit 206 includes an external signal converting circuit 207, which is located outside an semiconductor device 203, and an internal signal converting circuit 208, which is located inside the semiconductor device 203. The external signal converting circuit 207 is connected to the protocol converter 202 by four (4) interface signal lines 210A, 210B, 210C, 210D, which transfer a test clock signal TCK, a test reset signal TRST, the test mode select signal TMS and the serial data input signal TDI, respectively. As well, the internal signal converting circuit 208 is connected to the TPA controller 205 by four (4) interface signal lines 211A, 211B, 211C, 211D, which transfer an internal test clock signal iTCK, an internal reset signal iTRST, an internal test mode select signal iTMS and an internal serial data input signal iTDI, respectively. The external signal converting circuit 207 is connected to the internal signal converting circuit 206 by interface signal terminals 109A, 209BCD, two interface signal lines 211A', 211BCD, which are formed in the semiconductor device 203, and two interface signal lines 210A', 210BCD, which are located outside the semiconductor device 203.

The protocol converter 202 is connected to the TAP controller 205 by an interface signal terminal 209E and an interface signal line 211E, which are formed in the semiconductor device 203, and an interface signal line 210E, which are located outside the semiconductor device 203. Therefore, an internal serial data output signal iTDO outputted from the TAP controller 205 is transferred on an interface signal line 201E via the interface signal terminal 209 E as a serial data output signal TDO.

Next, the structures of the external signal converting circuit 207 and of the internal signal converting circuit 208 are explained with reference to FIGS. 6 and 7 as follows.

Figure 6:
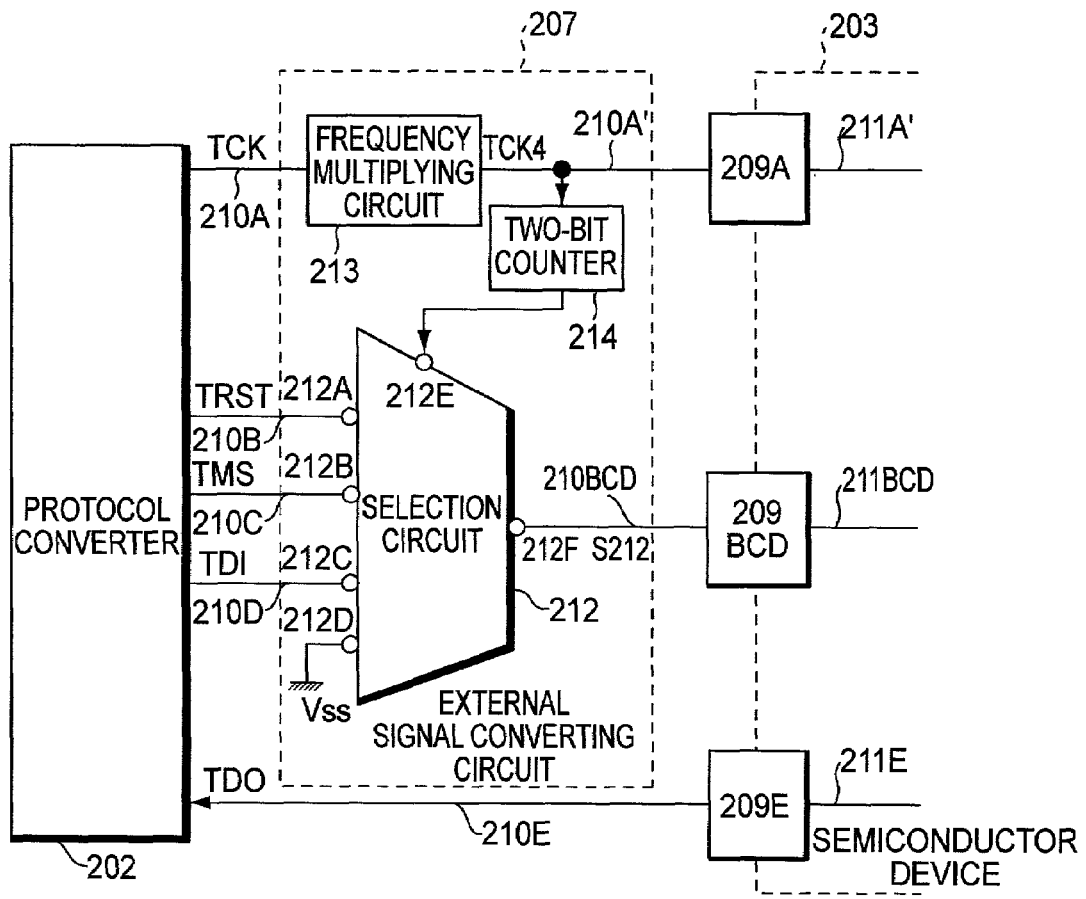
FIG. 6 is a circuit diagram of an external signal conversion circuit in the interface circuit of FIG. 5.

Referring to FIG. 6, the external signal converting circuit 207 includes a frequency multiplying circuit 213 for multiplying the frequency of the test clock signal TCK, a two-bit counter 214 for down-counting in response to an output signal of the frequency multiplying circuit 213, and a selection circuit 212 controlled by an output signal of the two-bit counter 214. The frequency multiplying circuit 213, which multiplies the frequency of the test clock signal TCK outputted from the protocol converter 202 by four (4), is connected to a interface signal terminal 209A of the semiconductor device 203 and the two-bit counter 214 by the interface signal line 210A'.

The two-bit counter 214 is connected to a control terminal 212E of the selection circuit 212. The two-bit counter 214 outputs a signal, which was down-counted in response to the test clock signal TCK4 multiplied by frequency multiplying circuit 213, to the control terminal 212E.

The selection circuit 212 includes first through fourth input terminals 212A-212D, and receives the test reset signal TRST, the test mode select signal TMS and the serial data input signal TDI, which are sent from the protocol converter 202, at its first through third input terminal 212A-212C. The fourth input terminal 212D is connected to ground, and the ground level voltage Vss, therefore, is supplied to the fourth input terminal 212D. An output terminal 212F of the selection circuit 212 is connected to the interface signal terminal 209BCD of the semiconductor device 203 by the interface signal line 210BCD. The selection circuit 221 selects one of the signal having the ground level voltage, the test reset signal TRST, the test mode select signal TMS and the serial data input signal TDI in response to the signal outputted from the two-bit counter214, and the selected signal is outputted to the interface signal terminal 209BCD. That is, the selection circuit 212 time-divides four kinds of the signals (the signal having the ground level voltage, the test reset signal TRST, the test mode select signal TMS and the serial data input signal TDI), and outputs them serially to the single interface signal line 210BCD as a time division serial output signal.

Figure 7:
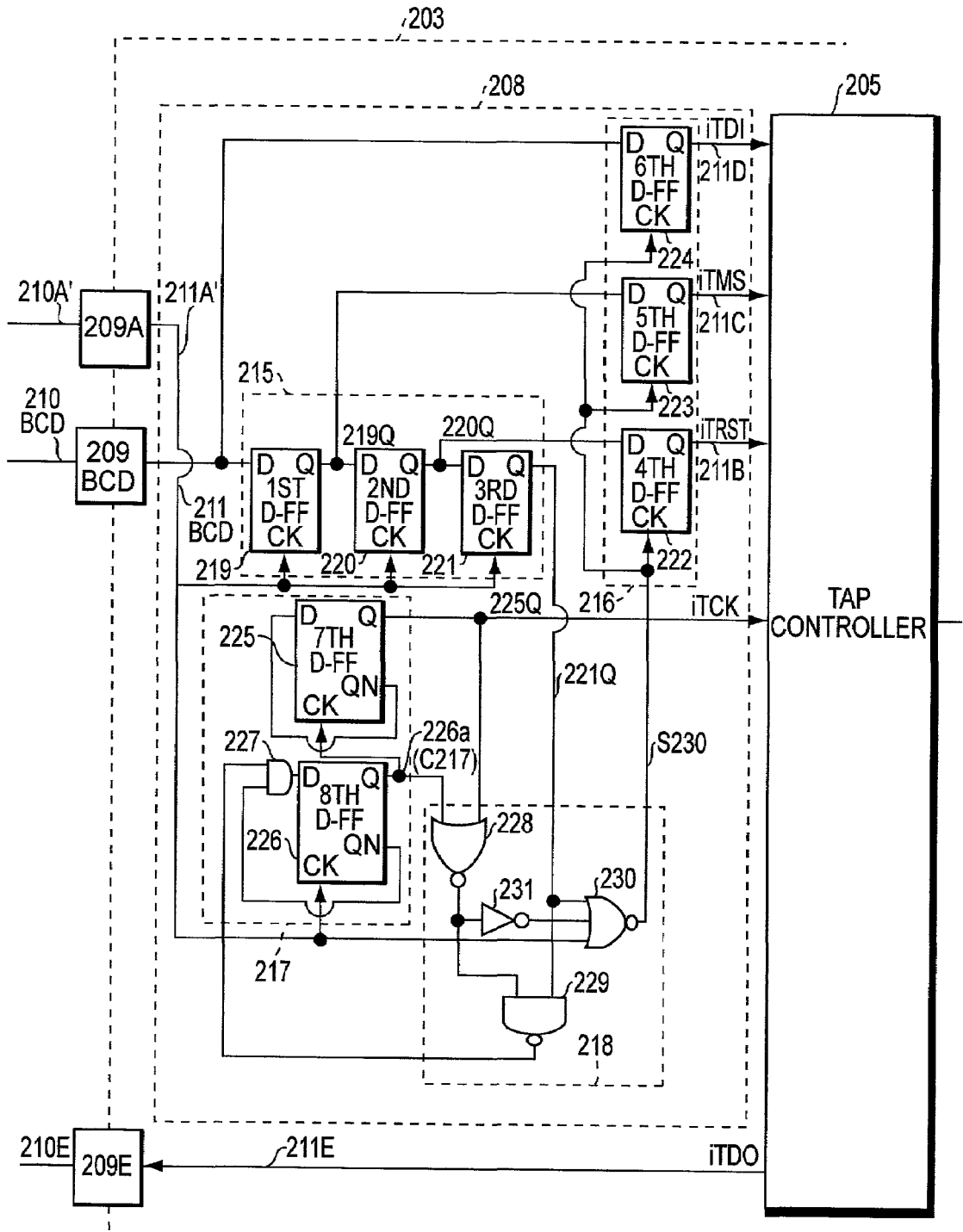
FIG. 7 is a circuit diagram of an internal signal conversion circuit in the interface circuit of FIG. 5.

Referring to FIG. 7, the internal signal converting circuit 208 includes a serial signal input circuit 215, a parallel signal output circuit 216, a two-bit down-counting circuit 217 and a control circuit 218. The serial signal input circuit 215 receives the time division serial output signal from the division circuit 212. The parallel signal output circuit 216 outputs a parallel signals (the internal reset signal iTRST, the internal test mode select signal iTMS and the internal serial data input signal iTDI), based on the time division serial output signal. The two-bit down-counting circuit 217 outputs the internal test clock signal iTCK, and the control circuit 218 controls the parallel signal output circuit 216.

The serial signal input circuit 215 includes a first holding circuit 219 such as a D(delay)-type flip-flop circuit (first D-FF circuit), a second holding circuit (second D-FF circuit) 220 and a third holding circuit (third D-FF circuit) 221. An input terminal D of the first D-FF circuit 219 is connected to the interface signal terminal 209BCD in order to receive the time division serial output signal. An output terminal Q of the first D-FF circuit 219 is connected to an input terminal D of the second D-FF circuit 220. An output terminal Q of the second D-FF circuit 220 is connected to an input terminal D of the third D-FF circuit 221. An output terminal D of the third D-FF circuit 221 is connected to the control circuit 218. Each of the first through third D-FF circuits 219, 220, 221 has a clock input terminal CK, which is connected to the interface signal terminal 209A.

The parallel signal output circuit 216 includes a fourth holding circuit (fourth D-FF circuit) 222, a fifth holding circuit (fifth D-FF circuit) 223 and a sixth holding circuit (sixth D-FF circuit) 224. The fourth D-FF circuit 222 outputs the internal test reset signal iTRST from its output terminal Q, the fifth D-FF circuit 223 outputs the internal test mode select signal iTMS from its output terminal Q, and the sixth D-FF circuit 224 outputs the internal serial data input signal iTDI from its output terminal Q. An input terminal D of the fourth D-FF circuit 222 is connected to the output terminal Q of the second D-FF circuit 220 in the serial signal input circuit 215. An input terminal D of the fifth D-FF circuit 223 is connected to the output terminal Q of the first D-FF circuit 219 in the serial signal input circuit 215. An input terminal D of the sixth D-FF circuit 223 is connected to the interface signal terminal 209BCD. Each of the fourth through sixth D-FF circuits 222, 223, 224 has a clock input terminal CK, which is connected to an output terminal of a three-input NOR gate 230 in the control circuit 218. The parallel signal output circuit 216 receives the time division serial output signal at the fourth through sixth D-FF circuits 222, 223, 224, and outputs the internal test reset signal iTRST, the internal test mode select signal iTMS, and the internal serial data input signal iTDI serially in response to a clock signal S230 outputted from the control circuit 218.

The two-bit down-counting circuit 217 includes a seven holding circuit (seventh D-FF circuit) 225, an eighth holding circuit (eighth D-FF circuit) 226 and a two-input AND gate 227. Each of the seven D-FF circuit 225 and the eight D-FF circuit 226 includes an input terminal D, a clock input terminal CK, a first output terminal Q and a second output terminal QN. The data terminal D of the eighth D-FF circuit 226 is connected to an output terminal of the two-input AND gate 227. The first output terminal Q of the eighth D-FF circuit 226 is connected to one of the input terminals of a two-input NOR gate 228 in the control circuit 218 and the clock input terminal CK of the seventh D-FF circuit 225. The second output terminal QN of the eighth D-FF circuit 226 is connected to one of the input terminals of the two-input AND gate 227. The clock input terminal CK of the eighth D-FF circuit 226 is connected to the interface signal terminal 209A. The other input terminal D of the two-input AND gate 227 is connected to an output terminal of a two-input NAND gate 229 in the control circuit 218.

The second output terminal QN of the seventh D-FF circuit 225 is connected to the TAP controller 205 and the other input terminal of the two-input NOR gate 228 of the control circuit 218. The input terminal D of the seventh D-FF circuit 225 is connected to the second output terminal QN of the seventh D-FF circuit 225. The two-bit down-counting circuit 217 outputs a two-bit counted value C217, and outputs the internal test clock signal iTCK having the same frequency as that of the test clock signal TCK by converting the frequency of the test clock signal TCK to one fourth part (¼) of the frequency.

The control circuit 218 includes the two-input NOR gate 228, two-input NAND gate 229, the three-input NOR gate 230, and an inverter 231. Input terminals of the three-input NOR gate 230 are connected to the output terminal Q of the third D-FF circuit 221 of the serial signal input circuit 215, an output terminal of the inverter 231 and interface signal terminal 209A, respectively. Input terminals of the two-input NAND gate 229 are connected to the output terminal Q of the third D-FF circuit 221 of the serial signal input circuit 215 and an output terminal of the two-input NOR gate 228. An input terminal of the inverter 231 is connected to an output terminal of the two-input NOR gate 228.

Next, the operation of the function test and the debug using the interface circuit 206 which connects the host computer 101 to the semiconductor device 103, is explained below with reference to FIGS. 8 and 9.

Figure 8:
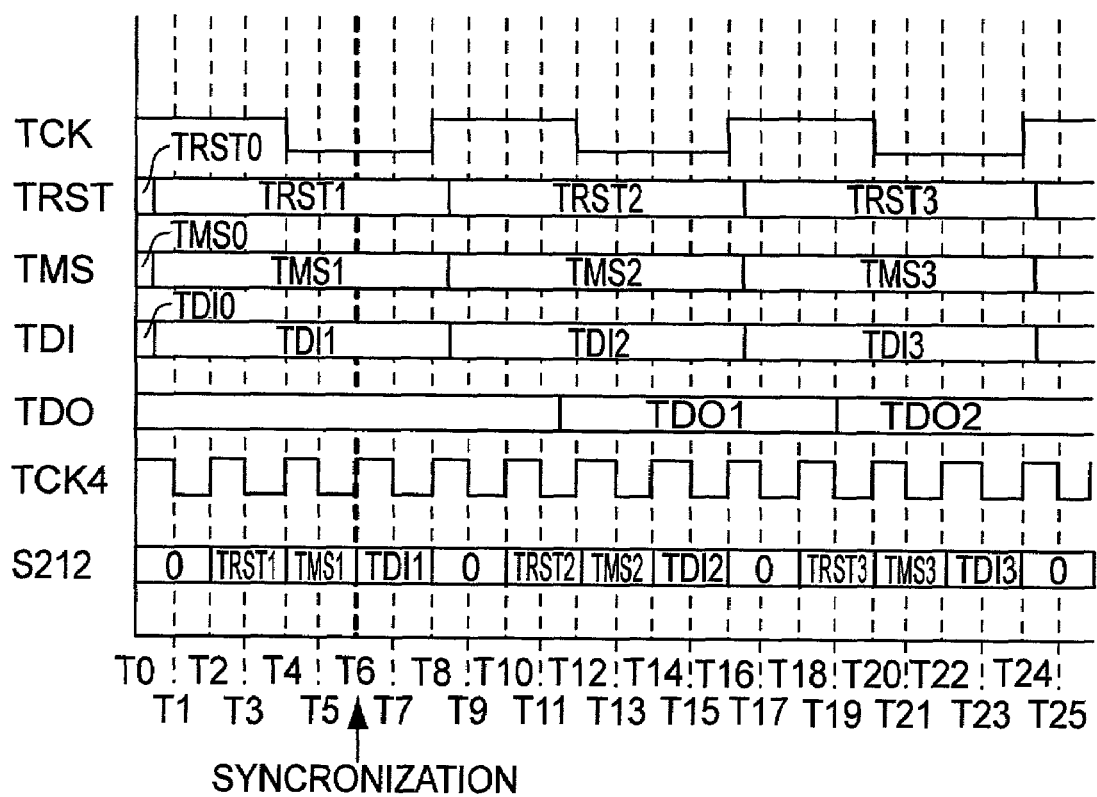
FIG. 8 is a timing chart showing the operation of the external signal converting circuit of FIG. 5.
Figure 9:
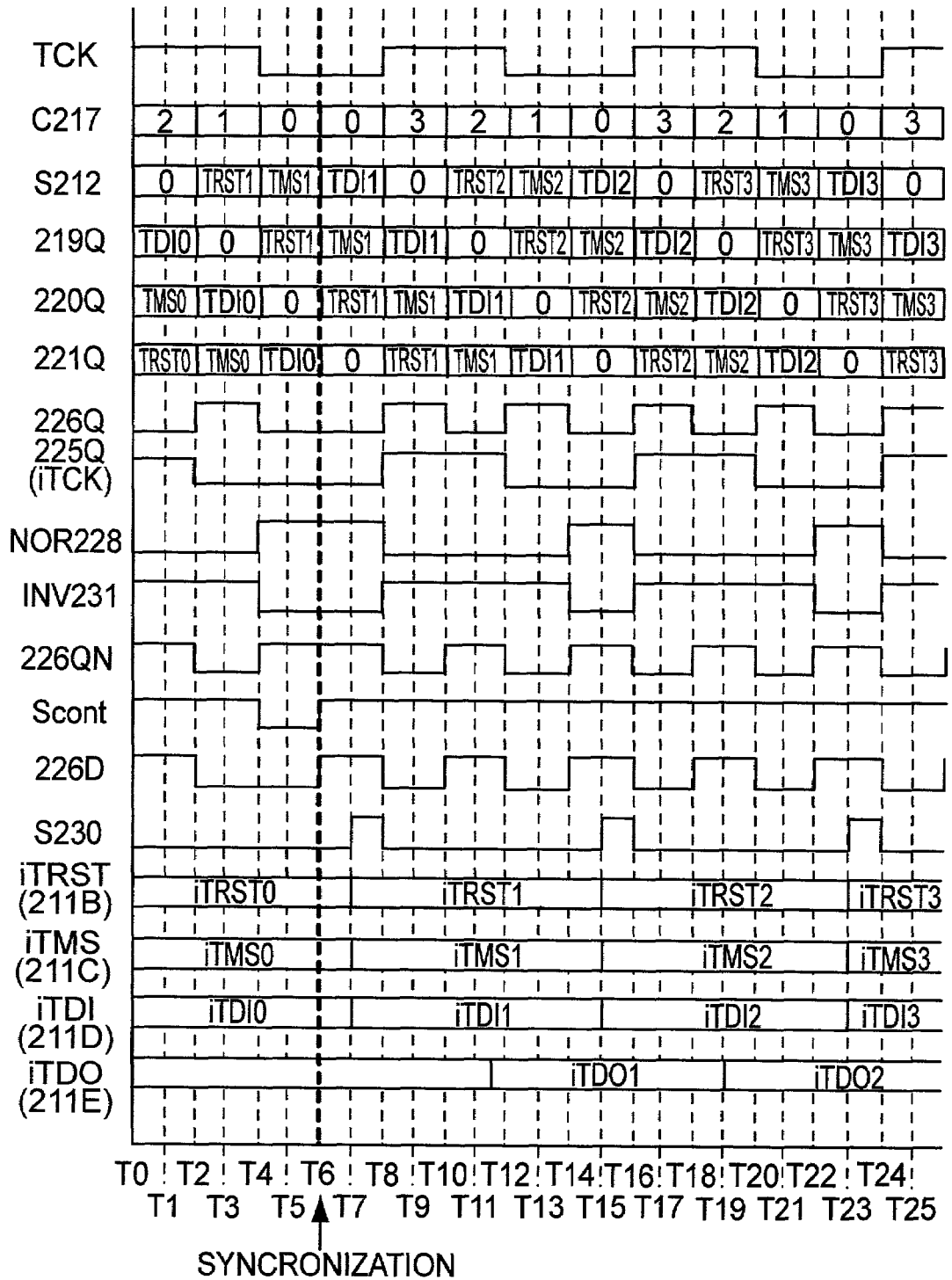
FIG. 9 is a timing chart showing the operation of the internal signal converting circuit of FIG. 5.

FIG. 8 is a timing chart showing the operation of the external signal converting circuit of the interface circuit 206 shown in FIG. 5, and FIG. 9 is a timing chart showing the operation of the internal signal converting circuit of the interface circuit 206 shown in FIG. 5. In FIGS. 8 and 9, the test clock signal TCK is synchronized with the internal test clock signal iTCK at time T6. Therefore, the operation of the interface circuit 206 before the test clock signal TCK is synchronized with the internal test clock signal iTCK, is shown FIGS. 8, 9 and the operation of the interface circuit 206 for testing or debugging the semiconductor device 203 after the test clock signal TCK is synchronized with the internal test clock signal iTCK, is shown FIGS. 8, 9.

In the second embodiment, the semiconductor device 203 includes three(3) interface signal terminals 209A, 209BCD, 208E. Therefore, when the test reset signal TRST the test mode select signal TMS and the serial data input signal TDI are sent from the protocol converter 202 to the TAP controller 205, these three signals are transferred serially as the time division serial output signal. To convert these three signals to the time division serial output signal, the test clock signal TCK is converted to the test clock signal TCK4 having the frequency four times higher than that of the test clock signal TCK in the interface circuit 206. However, the function test and the debug are performed by using the test clock signal TCK having the frequency that is set by the host computer 201. Therefore, the test clock signal TCK4 having the frequency four times higher than that of the test clock signal TCK should be reconverted to the test signal iTCK having the frequency, which equals that of the test clock signal TCK outputted from the protocol converter 202, when the internal test clock signal iTCK is inputted to the TAP controller 205. Further, the internal test clock signal iTCK as the result of the re-conversion should be synchronized with the test clock signal TCK outputted from the protocol converter 202. For example, while the internal test clock signal iTCK is not synchronized with the test clock signal TCK, the signals for the function test or for the debug may be changed before the signals reaches to the TAP controller 205 if the counting result of the two-bit down-counting circuit 217 shows "0" and if the time division serial output signal outputted from the third D-FF 221, which is the last stage of the serial signal input circuit 215, is not the fixed value "0". In such a case, the accurate function test and the accurate debug can not be performed. Specifically, during time T4-T6, when the time division serial output signal outputted from the third D-FF circuit 221 is an initial serial data input signal TDI0, the voltage level of the signal S230 outputted from the three-input NOR gate 230 is at the L level. As a result, since the signal S230 having the L level is inputted to the parallel signal output 216, an internal reset signal iTRST, an internal test mode select signal iTMS and an internal serial data input signal ITDI are not outputted from the parallel signal output 216 so that the expected function test or the debug is not performed. To avoid this operation, it is necessary to synchronize the internal test clock signal iTCK with the test clock signal TCK.

First, the operation of the interface circuit 206 before the test clock signal TCK outputted from the protocol converter 202 is synchronized with the internal test clock signal iTCK outputted from the internal signal converting circuit 208, is explained. Then, the operation of the interface circuit 206 after the test clock signal TCK is synchronized with the internal test clock signal iTCK, is explained.

Since the seventh D-FF circuit 225 and the eighth D-FF 226 of the two-bit down-counting circuit 217 circuit are not initialized, the counted value is unidentified. So, as an example, it is assumed that the counted value of the two-bit down-counting circuit 217 in its initial state is "2".

The test data for the function test of the semiconductor device 203 or the instruction data for the debug of the semiconductor device 203 are outputted from the host computer 201 to the protocol converter 202. The test data and the instruction data are converted to the JTAG interface signals (the test clock signal TCK, the test reset signal TRST, the test mode select signal TMS, the serial data input signal TDI) in the protocol converter 202, and the JTAG interface signals TCK, TRST, TMS, TDI are sent to the external converting circuit 207. Each of the JTAG interface signals is changed as shown in FIG. 8. For example, the test reset signal TMS becomes a first test reset signal TRST1, a second test reset signal TRST2, a third test reset signal TRST3 and so on from an initial test reset signal TRST0 in response to successive transitions of the test clock signal TCK from the L level to the H level. Each of the first through third test reset signals TRST1-3 is outputted from the protocol converter 202 to the selection circuit 212 of the external signal converting circuit 207 after the level of the test clock signal TCK is changed to the H level completely. As well, the test mode select signal TMS becomes a first test mode select signal TMS1, a second test mode select signal TMS2, a third test mode select signal TMS3 and so on from an initial test mode select signal TMS0 in response to successive transition of the test clock signal TCK from the L level to the H level. Each of the first through third test mode select signals TMS1-3 is outputted from the protocol converter 202 to the selection circuit 212 of the external signal converting circuit 207 after the level of the test clock signal TCK is changed to the H level completely. Further, the test serial data input signal TDI becomes a first test serial data input signal TDI1, a second test serial data input signal TDI2, a third test serial data input signal TDI3 and so on from an initial test serial data input signal TDI0 in response to successive transition of the test clock signal TCK from the L level to the H level. Each of the first through third test serial data input signals TDI1-3 is outputted from the protocol converter 202 to the selection circuit 212 of the external signal converting circuit 207 after the level of the test clock signal TCK changed to the H level completely. Therefore, the changes of these signals TRST1-3, TMS1-3, TDI1-3 are delayed from the transition of the test clock signal TCK from the L level to the H level.

As shown in FIG. 8, one cycle of the test clock TCK equals the time period from time T0 to time T8. When the test clock TCK having this cycle is inputted to the frequency multiplying circuit 213 of the external signal converting circuit 207, the frequency multiplying circuit 213 outputs the test clock signal TCK4 having the frequency four times higher than that of the test clock signal TCK. In other words, one cycle of the test clock TCK4 equals the time period from time T0 to time T2. The test clock signal TCK4 is outputted to the interface terminal 209A and to the two-bit counter 214 via the interface signal line 210A'.

In the two-bit counter 214, the down counting operation, such as "0", "3", "2", "1", "0", "3", "2" and so on, is performed repeatedly in response to the successive transition of the test clock signal TCK4 from the L level to the H level. When one of these counted values is inputted to the control terminal 212E of the selection circuit, one of the signals TRST, TMS, TDI and Vss is selected by the selection circuit in response to the counted value, and the time division serial output signal S212, which is selected by selection circuit 212, is outputted to the interface signal terminal 209BCD. The time division serial output signal S212 is changed in the order of the fixed value "0", the initial test reset signal TRST0, the initial test mode select signal TMS0, the initial serial data input signal TDI0, the fixed value "0", the first test reset signal TRST1, the first test mode select signal TMS1, the first serial data input signal TDI1, the fixed value "0" and so on.

The time division serial output signal S212 is inputted to the first D-FF circuit 219 of the serial signal input circuit 215 and to the sixth D-FF circuit 224 of the parallel signal output circuit 216. In the serial signal input circuit 215, the time division serial output signal S212 outputted from transfer signal terminal 209BCD is captured at the first D-FF circuit 219 in response to the test clock signal TCK4. Then, the first D-FF circuit 219 outputs the captured signals S212 as a time division signal 219Q to the second D-FF circuit 219. However, even if the first D-FF circuit 219 outputs the time division serial output signal 219Q to the second D-FF circuit 219, the second D-FF circuit 219 does not capture the time division serial output signal 219Q because of the state of the test clock signal TCK4. Then, when the test clock signal TCK4 rises, the second D-FF circuit 219 captures the time division serial output signal 219Q. The operation of the third D-FF circuit 221 is the same described above. Therefore, as shown in FIG. 9, comparing to the change of the time division serial output signal S212, the change of the time division serial output signal 219Q is delayed for one cycle of the test clock signal TCK4. Further, comparing to the change of the time division serial output signal 219Q, the change of the time division serial output signal 220Q outputted from the second D-FF circuit 220 is delayed for one cycle of the test clock signal TCK4. Moreover, comparing to the change of the time division serial output signal 220Q, the change of the time division serial output signal 221Q outputted from the third D-FF circuit 221 is delayed for one cycle of the test clock signal TCK4. For example, the time division serial output signal 219Q is changed from the fixed value "0" to the first test reset signal TRST1 at time T4. The time division serial output signal 220Q is changed from the fixed value "0" to the first test reset signal TRST1 at time T6, which is delayed for one cycle of the test clock signal TCK4. Then, the time division serial output signal 221Q is inputted to the two-input NAND gate 229 and the three-input NOR gate 230.

The two-input NAND gate 229 controls the two-bit down counting circuit 217 in response to the time division serial output signal 221Q and the output signal from the two-bit down counting circuit 217. AS shown in FIG. 9, when the counted value becomes "0" during time T4-T6 by performing the down-counting in the two-bit down counting circuit 217 (Namely, when the voltage level of output signals 225Q, 226Q, which are outputted from the two-bit down counting circuit 217, is at the L level), a voltage level of an output signal of the two-input NOR gate 228 becomes the L level. That is, the two-input NAND gate 229 receives the output signal having the H level at one of its input terminals. Therefore, during time T4-T6, the voltages level of the output signal Scont of the two-input NAND gate 229 of the control circuit 218 is determined by the time division serial output signal 221Q, which is inputted to the other input terminal of the two-input NAND gate 229. While the test clock signal TCK is synchronized with the internal test clock signal iTCK, in other words, while the time division serial output signal 221Q is one of the test reset signal TRST, the test mode select signal TMS and the serial data input signal TDI, not the fixed value "0", the voltages level of the output signal Scont of the two-input NAND gate 229 is at the L level. While the voltages level of the output signal Scont of the two-input NAND gate 229 is at the L level, voltage level of the output signal from the two-input AND gate 227 of the two-bit down counting circuit 217 is maintained at the L level.

Since the voltages level of the output signal Scont of the two-input NAND gate 229 is at the L level during time T4-T6, the counted value C217 outputted from the two-bit down counting circuit 217 is "0" during time T6-T8, that is, the voltage level of output signals 225Q, 226Q, which are outputted from the two-bit down counting circuit 217, is at the L level. As a result, the internal test clock signal iTCK is maintained at the L level during time T6-T8. On the other hand, since the time division serial output signal 221Q outputted from the third D-FF circuit 221 is changed to the fixed value "0" during the time T6-T8, the voltage level of the output signal Sount from the two-input NAND gate 229 is changed to the H level. As a result, after time T8, the down-counting operation, such as "3", "2", "1", "0", "3", "2" and so on, is performed in the two-bit down counting circuit 217. Therefore, as shown in FIG. 9, at time T6, the internal test clock signal iTCK is synchronized with the test clock signal TCK.

In the description above regarding the synchronization between the internal test clock signal iTCK and the test clock signal TCK. The initial counted value of the two-bit down counting circuit 217 is two "2". However, the same operation regarding the synchronization is performed when the initial counted value C217 of the two-bit down counting circuit 217 is three "3" or one "1". That is, the counted value C217 of the two-bit down counting circuit 217 is maintained at "0" until the internal test clock signal iTCK is synchronized with the test clock signal TCK. When the initial counted value C217 of the two-bit down counting circuit 217 is zero "0", even if the time division serial output signal 221Q from the third D-FF circuit 221 is the fixed value "0", the time division serial output signal 221Q is not maintained at the fixed value "0". Therefore, the synchronization between the internal test clock signal iTCK and the test clock signal TCK is terminated, and the operation to make the internal test clock signal iTCK and the test clock signal TCK synchronize is performed.

Next, the operation of the interface circuit 206 after the test clock signal TCK outputted is synchronized with the internal test clock signal, is explained with reference FIG. 9 mainly.

After the internal test clock signal iTCK is synchronized with the test clock signal TCK at time T6, the test clock signal TCK4 having the frequency four time higher than that of the test clock signal TCK on the interface signal terminal 209A is converted to the internal test clock signal iTCK having the frequency, which equals the frequency of the test clock signal TCK, by the seventh and eighth D-FF circuits 225, 226 of the two-bit down counting circuit 217, and the converted internal test clock signal iTCK is outputted to the TAP controller 205. That is, the two-bit down counting circuit 217 reduces the frequency of the test clock signal TCK4 into one fourth, and outputs the signal having reduced frequency as the internal test clock signal iTCK.

The time divided serial signal S212 on the interface signal terminal 209BCD is inputted to the sixth D-FF circuit 224 of the parallel signal output circuit 216 and the first D-FF circuit 219 of the serial signal input circuit 215. Since the select circuit 212 selects the different signal in response to the test clock signal TCK4, the sixth D-FF circuit 224 receives the first serial data input signal TDI1 at time T6, the fixed value "0" at time T8, the second test reset signal TRST2 at time T10 and so on as shown in FIG. 8. The first D-FF circuit 219 outputs the time division signal 219Q to the fifth D-FF circuit 223 every one cycle of the test clock signal TCK4. For example, the fifth D-FF circuit 223 receives the first test mode select signal TMS1 at time T6, the first serial data input signal TDI1 at time T8, the fixed value "0" at time T10, the second test reset signal TRST2 at time T12 and so on as the time division serial output signal 219Q. The second D-FF circuit 220 outputs the time division serial output signal 220Q to the fourth D-FF circuit 222 every one cycle of the test clock signal TCK4. For example, the fourth D-FF circuit 222 receives the first reset signal TRST1 at time T6, the first test mode select signal TMS1 at time T8, the first serial data input signal TDI1 at time T10, the fixed value "0" at time T12, and so on as the time division serial output signal 220Q.

The three-input NOR gate 230 in the control circuit 218 receives the time division serial output signal 221Q outputted from the third D-FF circuit 221, the signal from the inverter 231 and test clock signal TCK4, and outputs a signal S230 for controlling the fourth through sixth D-FF circuits 222, 223, 224. That is, the three-input NOR gate 230 outputs the signal S230 having H level when the voltage level of its input signals is the L level, and outputs the signal S230 having L level when the voltage level of one of its input signals is the H level.

The signal waveform of the signal S230 is explained below with reference to FIG. 9. As described above, since the voltage level of output signals 225Q, 226Q, which are outputted from the two-bit down counting circuit 217, is at the L level during time T6-T8 after the internal test clock signal iTCK is synchronized with the test clock signal TCK at time T6, the voltage level of the signal outputted from the two-input NOR gate 228 is at the H level, and the voltage level of the signal outputted from the inverter 231 is at the L level. The third D-FF circuit 221 outputs the time division serial output signal having the fixed value "0" during the time T6-T8. That is, the voltage level of the time division serial output signal is at the L level. Further, although the voltage level of the test clock signal TCK4 is at the H level during the time T6-T8, the voltage level of the test clock signal TCK4 is changed to the L level during the time T7-T8. Therefore, the voltage level of the three signals inputted to the three-input NOR gate 230 is at the L level during the time T7-T8. Thus, as shown in FIG. 9, the voltage level of the signal S230 outputted from the three-input NOR gate 230 is changed to the H level during the time T7-T8.

During time T8-T14, the time division serial output signal 221Q outputted from the third D-FF circuit becomes the fist test reset signal TRST1, the first test mode select signal TMS1 and the first serial data input signal TDI1 in that order. Therefore, the voltage level of the time division serial output signal 221Q is at the H level in this time period. Further, since the two-bit down counting circuit 217 performs the down-counting operation, such as "3 (the signal 225Q=the L level, the signal 226=the L level)", "2 (the signal 225Q=the H level, the signal 226=the L level)" and "1 (the signal 225Q=the L level, the signal 226=the HL level)", the voltage level of the signal outputted from the two-input NOR gate 228 is at the L level, and the voltage level of the signal outputted from the inverter 231 is at the H level during time T8-T14. Therefore, during time T8-T14, the voltage level of at least one of the three signals inputted to the three-input NOR gate 230 is at the H level so that the three-input NOR gate 230 outputs the signal S230 having the L level in this time period.

After that, during time T14-T16, the time division serial output signal 221Q becomes the fixed value "0" (L level), and the counted value in the two-bit down counting circuit 217 becomes "0" (the signal 225Q =the L level, the signal 226=the L level). As a result, the voltage level of the signal outputted from the two-input NOR gate 228 is changed to the H level, and the voltage level of the signal outputted from the inverter 231 is changed to the L level during time T14-T16. Further, the voltage level of the test clock signal TCK4 is at the H level during time T14-T15, and is changed to the L level during time T15-T16. Thus, during time T15-T16, the voltage level of the three signals inputted to the three-input NOR gate 230 is at the L level so that the three-input NOR gate 230 outputs the signal S230 having the H level in this time period. Then, the signal waveform of the signal S230 during time T8-T16 is repeated after time T16.

The signal S230 having the waveform described above is inputted to a clock input terminal CK of each of the fourth through sixth D-FF circuits 222, 223, 224. In each of the fourth through sixth D-FF circuits 222, 223, 224, the time division serial output signal is changed in response to the successive transition of the signal S230 from the L level to the H level, and is outputted to the TAP controller 205. For example, an output signal on an interface signal line 211B from the fourth D-FF circuit 222 is changed from the initial internal test reset signal iRST0 to the first internal test reset signal iRST1 at time T7, and then, is changed from the first internal test reset signal iRST1 to the second internal test reset signal iRST2 at time T15. As well, an output signal on an interface signal line 211C from the fifth D-FF circuit 223 is changed from the initial internal test mode select signal iTMS0 to the first internal test mode select signal iTMS1 at time T7, and then, is changed from the first internal test mode select signal iTMS1 to the second internal test mode select signal iTMS2 at time T15. As well, an output signal on an interface signal line 211D from the sixth D-FF circuit 224 is changed from the initial internal serial data input signal iTDI0 to the first internal serial data input signal iTDI1 at time T7, and then, is changed from the first internal serial data input signal iTDI1 to the second internal serial data input signal iTDI2 at time T15.

The internal test clock signal iTCK, the internal test reset signal iTRST, the internal mode select signal iTMS, and the internal serial data input signal iTDI, whose values are changed as described above, are inputted to the TAP controller 205, The TAP controller captures the value of each of the internal test reset signal iTRST, the internal mode select signal iTMS, and the internal serial data input signal iTDI in response to the transition of the internal test clock signal iTCK.

The function test or the debug is performed in the internal circuit 204 of the semiconductor device 203 in response to the captured signals. Then, a signal showing the test result of the debug result is inputted to the TAP controller 205 from the internal circuit 204. The TAP controller 105 outputs an output signal on an interface signal line 211E as the internal serial output signal iTDO to the interface signal terminal 209E in response to the transition of the internal test clock signal iTCK from the H level to the L level at time T12 or T20. For example, as shown in FIG. 9, the internal serial output signal iTDO is changed from the initial internal serial output signal iTDO0 to the first internal serial output signal iTDO1 in response to the transition of the internal test clock signal iTCK from the H level to the L level at time T12, and the internal serial output signal iTDO is changed from the first internal serial output signal iTDO1 to the seconds internal serial output signal iTDO2 in response to the successive transition of the internal test clock signal iTCK from the H level to the L level at time T20.

This internal serial data output signal iTDO is transferred to the protocol converter 202 via the interface signal line 201 E as the serial data output signal TDO. Then, the host commuter 201 analyzes the serial data output signal TDO, and the function test or the debug is completed.

As described above, according to the second embodiment, the interface circuit 206 includes the external signal converting circuit 207 outside the semiconductor device 203, and the internal signal converting circuit 208 in the semiconductor device 203. Further, the selection circuit 212, which is controlled by the test clock signal TCK4 having the frequency four times higher than that of the test clock signal TCK, time-divides three signals (the test reset signal TRST, the test mode select signal TMS and the serial data input signal TDI) of the JTAG interface signals, and outputs the test reset signal TRST, the test mode select signal TMS and the serial data input signal TDI serially as the time divided serial signal on the signal interface signal line connecting the external signal converting circuit 207 to the internal signal converting circuit 208. In the internal signal converting circuit 208, the first through third D-FF circuits 219, 220, 221 of the serial signal input circuit 215 and the fourth through sixth D-FF circuits 222, 223, 224 of the parallel signal output circuit 216 transfer the test reset signal TRST, the test mode select signal TMS and the serial data input signal TDI outputted as the time division serial output signal to the TAP controller 205 via the different transfer signal lines 221B, 221C, 221D, respectively. Further, the two-bit down counting circuit 217 reduces the frequency of the test clock signal TCK4 into one fourth, and outputs the signal having reduced frequency as the internal test clock signal iTCK. Thus, comparing to the first embodiment, it is possible to further reduce the number of interface signal terminals, which are used for transferring the JTAG interface signal for the function test or the debug. Thus, it is possible to form a space between the interface signal terminals formed on the semiconductor device enough to avoid electric short by contacting the terminals. That is, according to the second embodiment, since the number of interface signal terminals can be reduced in the downsized semiconductor device, an accurate function test or an accurate debug can be performed using the JTAG interface signals. Further, by reducing the number of interface signal terminals, the production cost of the semiconductor device also can be reduced.

While the present invention has been described with reference to illustrative embodiments, this description is not intended to be construed in a limiting sense. Various other modifications of the illustrated embodiments, as well as other embodiments of the invention, will be apparent to those skilled in the art on reference to this description. Therefore, the appended claims are intended to cover any such modifications or embodiments as fall within the true scope of the invention.

What I claim is:

1. An interface circuit transferring a clock signal and first and second interface signals inputted from the outside of a semiconductor device to an internal circuit of the semiconductor device, comprising:

a selection circuit receiving the first and second interface signals, generating a time division serial output signal by selecting one of the first and second interface signals in response to the voltage level of the clock signal, and outputting the time division serial output signal to a single input terminal of the semiconductor device via a single signal line;

a first holding circuit connected to the single input terminal for receiving the time division serial output signal, the first holding circuit capturing the first interface signal of the time division serial output signal in response to the transition of the voltage level of the clock signal from a L level to a H level and outputting the first interface signal to the internal circuit; and a second holding circuit connected to the single input terminal for receiving the time division serial output signal, the second holding circuit capturing the second interface signal of the time division serial output signal in response to the transition of the voltage level of the clock signal from the H level to the L level and outputting the second interface signal to the internal circuit.

2. The interface circuit as claimed in claim 1, wherein the selection circuit selects and outputs the first interface signal as the time division serial output signal in response to the transition of the voltage level of the clock signal from the L level to the H level, and selects and outputs the second interface signal as the time division serial output signal in response to the transition of the voltage level of the clock signal from the H level to the L level, the first holding circuit maintains to hold the first interface signal while the voltage level of the clock signal is at the H level, the first holding circuit further maintains to hold the first interface signal at the voltage level of the clock signal is changed from the H level to the L level, and the first holding circuit further maintains to hold the first interface signal while the voltage level of the clock signal is maintained at the L level after the voltage level of the clock signal is changed from the H level to the L level, and the second holding circuit maintains to hold the second interface signal while the voltage level of the clock signal is at the L level, the second holding circuit further maintains to hold the second interface signal at the voltage level of the clock signal is changed from the L level to the H level, and the second holding circuit further maintains to hold the second interface signal while the voltage level of the clock signal is maintained at the H level after the voltage level of the clock signal is changed from the L level to the H level.

3. The interface circuit as claimed in claim 1, wherein the selection circuit is formed outside the semiconductor device and the first and second holding circuits are formed inside the semiconductor device.

4. The interface circuit as claimed in claim 1, wherein the first interface signal selects an operation mode of the internal circuit, and the second interface signal performs the selected operation in the internal circuit.

5. The interface circuit as claimed in claim 4, wherein the clock signal and the first and second interface signals are standardized by IEEE Std 1149.1-1990.

6. The interface circuit as claimed in claim 1, wherein
the semiconductor device further includes a control circuit, which connected between the interface circuit and the internal circuit, for controlling the internal circuit, and wherein the clock signal and the first and second interface signals outputted from the first and second holding circuits, respectively, are inputted to the control circuit, and
the first and second interface signals inputted to the control circuit are outputted to the internal circuit in response to the transition of the voltage level of the clock signal.

7. The interface circuit as claimed in claim 6, wherein
the selection circuit selects and outputs the first interface signal as the time division serial output signal in response to the transition of the voltage level of the clock signal from the L level to the H level, and selects and outputs the second interface signal as the time division serial output signal in response to the transition of the voltage level of the clock signal from the H level to the L level,
the first holding circuit maintains to hold the first interface signal while the voltage level of the clock signal is at the H level, the first holding circuit further maintains to hold the first interface signal at the voltage level of the clock signal is changed from the H level to the L level, and the first holding circuit further maintains to hold the first interface signal while the voltage level of the clock signal is maintained at the L level after the voltage level of the clock signal is changed from the H level to the L level, and
the second holding circuit maintains to hold the second interface signal while the voltage level of the clock signal is at the L level, the second holding circuit further maintains to hold the second interface signal at the voltage level of the clock signal is changed from the L level to the H level, and the second holding circuit further maintains to hold the second interface signal while the voltage level of the clock signal is maintained at the H level after the voltage level of the clock signal is changed from the L level to the H level.

8. The interface circuit as claimed in claim 7, wherein the selection circuit is formed outside the semiconductor device and the first and second holding circuit are formed inside the semiconductor device.

9. The interface circuit as claimed in claim 7, wherein the first interface signal selects an operation mode of the internal circuit, and the second interface signal performs the selected operation in the internal circuit.

10. The interface circuit as claimed in claim 9, wherein the clock signal and the first and second interface signals are standardized by IEEE Std 1149.1-1990.

11. An interface circuit transferring a first clock signal having a first frequency, first through third interface signals and a signal having a fixed voltage, which are inputted from the outside of a semiconductor device to an internal circuit of the semiconductor device, comprising:
a first frequency converting circuit generating a second clock signal having a second frequency by multiplying the first frequency of the first clock signal;
a first two-bit counter connected to the first frequency converting circuit for outputting a signal having four counted values;
a selection circuit receiving the first through third interface signals and the signal having the fixed voltage, generating a first time division serial output signal by selecting one of the first through three interface signals and the signal having the fixed voltage in response to the signal outputted from the first two-bit counter, and outputting the first time division serial output signal to a single input terminal of the semiconductor device via a single signal line, the first time division serial output signal consisting of the first through third interface signals and the signal having the fixed voltage;
a serial signal input circuit receiving the first time division serial output signal, outputting a second time division serial output signal, which is delayed from the first time division serial output signal for one cycle of the second clock signal in response to the second clock signal, outputting a third time division serial output signal, which is delayed from the second time division serial output signal for one cycle of the second clock signal in response to the second clock signal, and outputting a fourth time division serial output signal, which is delayed from the third time division serial output signal for one cycle of the second clock signal in response to the second clock signal;
a second frequency converting circuit generating a third clock signal having the first frequency by converting the second frequency of the second clock signal;
a control signal generating circuit outputting a control signal in response to the second and third clock signal and the fourth time division serial output signal; and
a parallel signal output circuit capturing the first interface signal of the first time division serial output signal, capturing the second interface signal of the second time division serial output signal, capturing the third interface signal of the third time division serial output signal, in response to the control signal, and outputting the first through third interface signals.

12. The interface circuit as claimed in claim 11, wherein the serial signal input circuit includes
a first holding circuit receiving the first time division serial output signal, and outputting the second time division serial output signal in response to the second clock signal,
a second holding circuit receiving the second time division serial output signal, and outputting the third time division serial output signal in response to the second clock signal,
a third holding circuit receiving the third time division serial output signal, and outputting the fourth time division serial output signal in response to the second clock signal, and
wherein the parallel signal output circuit includes,
a fourth holding circuit receiving the third time division serial output signal, and outputting the third interface signal in response to the control signal,
a fifth holding circuit receiving the second time division serial output signal, and outputting the second interface signal in response to the control signal, and a sixth holding circuit receiving the first time division serial output signal, and outputting the first interface signal in response to the control signal.

13. The interface circuit as claimed in claim 12, further including first through third signal lines, each of which is connected to the parallel signal output circuit, each of the first through third signal lines transferring one of the first through third interface signal.

14. The interface circuit as claimed in claim 13, wherein the first frequency converting circuit and the selection circuit are formed outside the semiconductor device and the serial signal input circuit, the second frequency converting circuit, and the control signal generating circuit are formed inside the semiconductor device.

15. The interface circuit as claimed in claim 13, wherein the first interface signal selects an operation mode of the internal circuit, the second interface signal performs the selected operation in the internal circuit, and the third interface signal reset the selected operation in the internal circuit.

16. The interface circuit as claimed in claim 15, wherein the clock signal and the first through third interface signals are standardized by IEEE Std 1149.1-1990.

17. The interface circuit as claimed in claim 11, wherein the second frequency converting circuit includes a second two-bit counter for performing a down-counting operation based on the second frequency of the second clock signal, and outputs two signals, wherein one of the two signal is the third clock signal, and wherein the third clock signal and the other signal outputted from the second frequency converting circuit are inputted to the control signal generating circuit.

18. The interface circuit as claimed in claim 17, wherein
the semiconductor device further includes a control circuit, which connected between the interface circuit and the internal circuit, for controlling the internal circuit, and wherein the clock signal and the first through third interface signals outputted from the parallel signal output circuit are inputted to the control circuit, and
the first through third interface signals inputted to the control circuit are outputted to the internal circuit in response to the transition of the voltage level of the third clock signal.

19. The interface circuit as claimed in claim 18, wherein the first frequency converting circuit and the selection circuit are formed outside the semiconductor device and the serial signal input circuit, the second frequency converting circuit, and the control signal generating circuit are formed inside the semiconductor device.

20. The interface circuit as claimed in claim 18, wherein the first interface signal selects an operation mode of the internal circuit, the second interface signal performs the selected operation in the internal circuit, and the third interface signal reset the selected operation in the internal circuit.

21. The interface circuit as claimed in claim 20, wherein the clock signal and the first through third interface signals are standardized by IEEE Std 1149.1-1990.

22. A method of testing or debugging a semiconductor device by transferring a clock signal and first and second interface signals inputted from the outside of a semiconductor device to an internal circuit of the semiconductor device, comprising:
generating a time division serial output signal by selecting one of the first and second interface signals in response to the voltage level of the clock signal;
transferring the time division serial output signal to a single input terminal of the semiconductor device via a single signal line, and then transferring the time division serial output signal to first and second hold circuits;
capturing the first interface signal of the time division serial output signal in the first holding circuit in response to the transition of the voltage level of the clock signal from a L level to a H level, and outputting the first interface signal;
capturing the second interface signal of the time division serial output signal in the second holding circuit in response to the transition of the voltage level of the clock signal from the H level to the L level, and outputting the second interface signal;
transferring the clock signal, the first interface signal outputted from the first holding circuit, and the second interface signal outputted from the second holding circuit to a control circuit, which controls the operation of the internal circuit; and
transferring the first and second interface signals inputted to the control circuit to the internal circuit in response to the clock circuit inputted to the control circuit in order to perform the test or the debug based on the clock signal and the first and second interface signals.

23. The method of testing or debugging a semiconductor device as claimed in claim 22, wherein the first interface signal is outputted from the first holding circuit in response to the transition of the voltage level of the clock signal from the L level to the H level, and is outputted continuously from the first holding circuit after the transition of the voltage level of the clock signal from the H level to the L level, and
wherein the second interface signal is outputted from the second holding circuit in response to the transition of the voltage level of the clock signal from the H level to the L level, and is outputted continuously from the second holding circuit after the transition of the voltage level of the clock signal from the L level to the H level.

24. The method of testing or debugging a semiconductor device as claimed in claim 23, wherein the time division serial output signal is generated outside the semiconductor device and transferred to the single input terminal of the semiconductor device.

25. The method of testing or debugging a semiconductor device as claimed in claim 23, wherein the first interface signal selects an operation mode of the internal circuit, and the second interface signal performs the selected operation in the internal circuit.

26. The method of testing or debugging a semiconductor device as claimed in claim 25, wherein the clock signal and the first and second interface signals are standardized by IEEE Std 1149.1-1990.

27. The method of testing or debugging a semiconductor device by transferring first through third interface signals inputted from the outside of a semiconductor device to an internal circuit of the semiconductor device, comprising:
converting a first clock signal having a first frequency provided from the outside of the semiconductor device to a second clock signal having a second frequency, which is multiplied from the first frequency, and outputting the second clock signal to the semiconductor device and a first two-bit counter;
generating a signal having four counted values in the first two-bit counter, and outputting the signal having four counted values to a selection circuit;
generating a first time division serial output signal by selecting one of the first through three interface signals and a signal having the fixed voltage inputted to the selection circuit in response to the signal outputted from the first two-bit counter;
outputting the first time division serial output signal, which consists of the first through third interface signals and the signal having the fixed voltage, to a single input terminal of the semiconductor device via a single signal line, and then transferring the first time division serial output signal on the single input terminal to a serial signal input circuit;
generating, based on the first time division serial output signal, a second time division serial output signal, which is delayed from the first time division serial output signal for one cycle of the second clock signal in response to the second clock signal, generating, based on the second time division serial output signal, a third time division serial output signal, which is delayed from the second time division serial output signal for one cycle of the second clock signal in response to the second clock signal, and generating, based on the third time division serial output signal, a fourth time division serial output signal, which is delayed from the third time division serial output signal for one cycle of the second clock signal in response to the second clock signal, in the serial signal input circuit;

transferring the first time division serial output signal on the single input terminal and the second and third time division serial output signal outputted from the serial signal input circuit to the parallel signal output circuit;

converting the second clock signal having the second frequency inputted to the semiconductor device to a third clock signal having the first frequency, and then inputting the third clock signal a control signal generating circuit and a control circuit, which controls the operation of the internal circuit;

generating a control signal in response to the second and third clock signal, which are inputted to the control signal generating circuit, and the fourth time division serial output signal, and then outputting the control signal to a parallel signal output circuit;

capturing the first interface signal of the first time division serial output signal, the second interface signal of the second time division serial output signal, the third interface signal of the third time division serial output signal in the parallel signal output circuit, in response to the control signal, and outputting the first through third interface signals to the control circuit;

transferring the first through third interface signals to the control circuit to the internal circuit in response to the third clock circuit inputted to the control circuit in order to perform the test or the debug based on the third clock signal and the first through third interface signals.

28. The method of testing or debugging a semiconductor device as claimed in claim 27, wherein each of the first through third interface signals outputted from the parallel signal output circuit is transferred to the control circuit on one of first through third signal lines.

29. The method of testing or debugging a semiconductor device as claimed in claim 28, wherein the first time division serial output signal is generated outside the semiconductor device and transferred to the single input terminal of the semiconductor device.

30. The method of testing or debugging a semiconductor device as claimed in claim 28, wherein the first interface signal selects an operation mode of the internal circuit, the second interface signal performs the selected operation in the internal circuit, and the third interface signal reset the selected operation in the internal circuit.

31. The method of testing or debugging a semiconductor device as claimed in claim 30, wherein the clock signal and the first through third interface signals are standardized by IEEE Std 1149.1-1990.

* * * * *